United States Patent
Washburn et al.

(10) Patent No.: US 7,579,971 B2
(45) Date of Patent: Aug. 25, 2009

(54) LOW DISTORTION DIGITAL TO ANALOG CONVERTER AND DIGITAL SIGNAL SYNTHESIZER SYSTEMS

(76) Inventors: Robert Washburn, 18425 Kingsport Dr., Malibu, CA (US) 90265; Robert F. McClanahan, 27781 Sequoia Glen Dr., Valencia, CA (US) 91354

( * ) Notice: Subject to any disclaimer, the term of this patent is extended or adjusted under 35 U.S.C. 154(b) by 0 days.

(21) Appl. No.: 10/898,006

(22) Filed: Jul. 23, 2004

(65) Prior Publication Data
US 2005/0062631 A1 Mar. 24, 2005

Related U.S. Application Data

(60) Provisional application No. 60/489,570, filed on Jul. 23, 2003.

(51) Int. Cl.
*H03M 1/66* (2006.01)
(52) U.S. Cl. .................... 341/144; 375/295
(58) Field of Classification Search ............... 341/144, 341/116, 143, 155; 375/376, 295
See application file for complete search history.

(56) References Cited

U.S. PATENT DOCUMENTS

| | | | | | |
|---|---|---|---|---|---|
| 3,986,232 | A | * | 10/1976 | Teetor | 24/67 R |
| 5,162,798 | A | * | 11/1992 | Yundt | 341/116 |
| 5,191,332 | A | * | 3/1993 | Shieu | 341/143 |
| 5,231,427 | A | * | 7/1993 | Ohashi | 347/55 |
| 5,268,688 | A | * | 12/1993 | Meyers et al. | 341/143 |
| 5,583,501 | A | * | 12/1996 | Henrion et al. | 341/118 |
| 5,587,711 | A | * | 12/1996 | Williams et al. | 341/144 |
| 5,627,538 | A | * | 5/1997 | Ferry | 341/144 |
| 5,963,157 | A | * | 10/1999 | Smith | 341/131 |
| 6,067,327 | A | * | 5/2000 | Creigh et al. | 375/295 |
| 6,300,890 | B1 | * | 10/2001 | Okuda et al. | 341/143 |
| 6,313,778 | B1 | * | 11/2001 | Ignjatovic et al. | 341/155 |
| 6,693,987 | B1 | * | 2/2004 | Hattori | 375/376 |
| 2004/0213356 | A1 | * | 10/2004 | Burke | 375/295 |

* cited by examiner

*Primary Examiner*—Jean B Jeanglaude
(74) *Attorney, Agent, or Firm*—J. D. Harriman, II; DLA Piper LLP (US)

(57) ABSTRACT

The present invention is a digital to analog converter circuit that provides significantly lower distortion than achieved by digital to analog converter circuits having comparable speed and resolution utilizing the present art. The present invention provides linear or higher order transitions between clock transition time points rather than step transitions used in the present art. Distortion reduction can exceed 30 dB in the embodiment with linear sample-to-sample transitions and greater in alternate embodiments with non-linear transitions. In other embodiments, the present invention can provide low distortion at resolutions from 16 to 24 bits or more at sample rates typical of high-speed 8-bit devices of the present art.

14 Claims, 27 Drawing Sheets

1 AMPLITUDE BIT

2 AMPLITUDE BITS

5 AMPLITUDE BITS

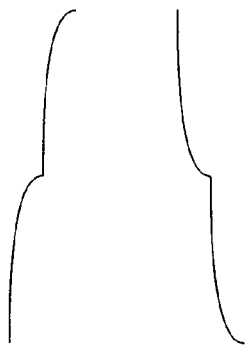
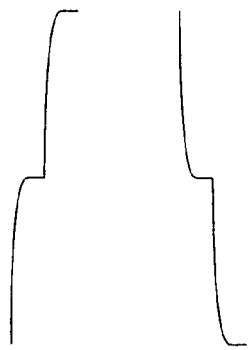
Figure 21A                    Figure 21B
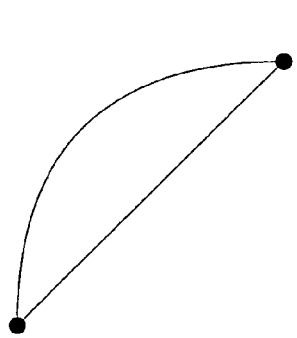
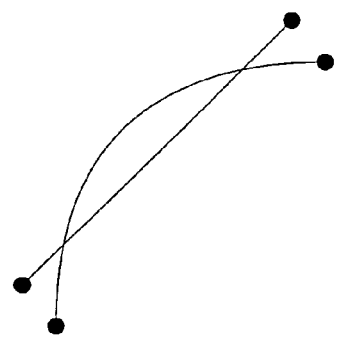
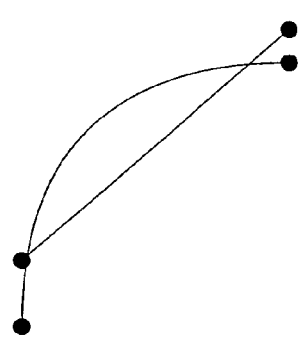
Figure 22A        Figure 22B        Figure 22C
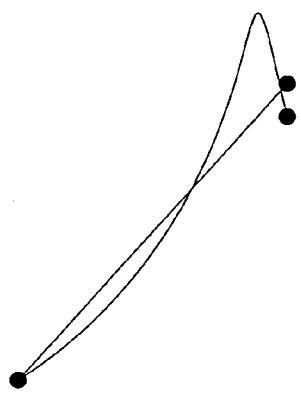
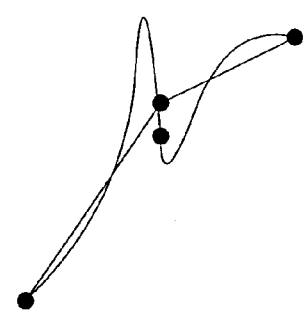
Figure 22D              Figure 22E

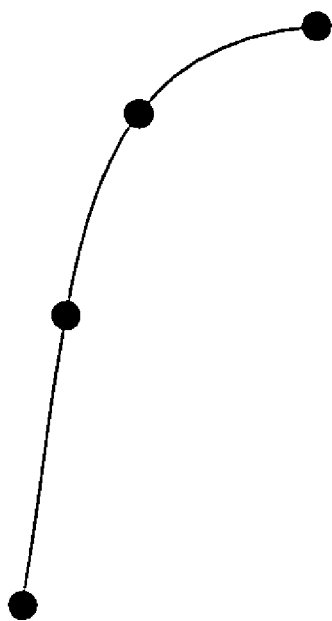
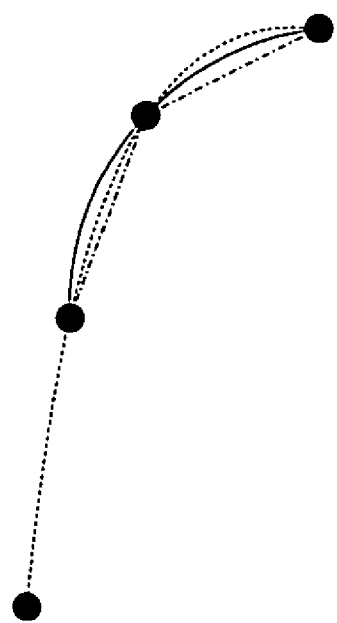
Figure 22F  Figure 22G

LOW DISTORTION DIGITAL TO ANALOG CONVERTER AND DIGITAL SIGNAL SYNTHESIZER SYSTEMS

CROSS-REFERENCE TO RELATED APPLICATION(S)

The present application claims the benefit of priority from pending U.S. Provisional Patent Application No. 60/489,570, entitled "Low Distortion Digital To Analog Converter And Digital Signal Synthesizer Systems", filed on Jul. 23, 2003, which is herein incorporated by reference in its entirety.

BACKGROUND OF THE INVENTION

1. Field of the Invention

The present invention relates to the field of digital to analog converters.

2. Background Art

The rapid expansion in the performance of digital computing and digital signal processing has made it possible to store, manipulate, process and even generate large amounts of data. It has enabled rapid information retrieval and sorting of large informational databases and the subsequent communication of the information around the world. It has enabled analysis of very large complex systems ranging from electronic circuitry, to physical structures, to weather and the movement and detection of astronomical bodies.

The expansion in computational capability has been so great that this time period is frequently referred to as the digital age. This has tended to mask the fact that much of the world, including the actual sensing of physical data, the actual changing of physical conditions, and the actual information communication processes remains analog. In digitally controlled machines, the motors, position sensors, video detectors and optical positioning devices, laser measurement or cutting subsystems, are among the many analog circuits that are controlled by the digital output from a computer or DSP. Even in the central processing units of the digital computers themselves, device switching between digital states and transfer of information can frequently appear to be more like analog than digital operations as clock speeds approach the state of the art at the time. Most important of all, human senses are analog. This creates a major need for analog-to-digital (A/D) and digital-to-analog converter (DAC) circuitry that is fast, handles large amounts of digital data and does not significantly distort or loose information in the analog signal.

Referring to FIG. 1, a representative DAC application is symbolically indicated. Digital Signal Source 100 provides source signal information in digital format to DAC 110. Complexity can vary from a simple addressable buss interface and holding register to a complete DSP with memory, clock generators, controllers, and any other system components. DAC 110 converts said source signal into an analog output signal that is passed to Analog Load 120. Analog Load 120 may be the final stage of a system such as a display or it may be a transmission stage to subsequent stages. Within Analog Load 120 or subsequent circuit stages, the DAC analog output signal may be converted to a digital format using an A/D converter.

A digital signal synthesizer system refers to combination of a Digital Signal Source 100 and one or more DAC 110 circuits wherein Digital Signal Source 100 includes means to configure digital input signals and control signals to DAC 110. Typically, a digital signal synthesizer system will include more than one DAC and may have more than one operating frequency band in which it generates signals. In a more restricted form, digital signal synthesizer systems may generate a limited set of predetermined wave shapes such as sinusoidal, square wave, pulse, or triangular waves.

FIG. 2 illustrates the minimum signal interface between Digital Signal Source 100 and DAC 110. In addition to signal data bits and a clock, DAC 110 may have multiple other control inputs. These may come from Digital Signal Source 100, other circuits, or from control signals originating external to the system partially illustrated in FIG. 1. Examples of additional input controls frequently provided in a DAC are shown in FIG. 4.

The largest number of bits commonly used is 24. The large number of bits provides sufficient resolution for the analog signal so that the distortion is very low. Values below 70 dB are common. The minimum number of bits used is 1. One use of a 1-bit DAC is in microwave and millimeter wave applications such as radar systems.

Use of a large number of bits severely limits the clock rate. A 24-bit DAC is limited to a clock rate of about 100 KHz with present technology. As the maximum allowed clock rate is increased, the cost of the DAC can raise to many times the cost of one that is not close to existent, technology limitations. The combination of high resolution, low distortion and low clock speed makes the use of 24-bit DAC circuits common in audio entertainment system applications.

High clock rates find frequent uses in systems requiring large amounts of data to be updated frequently. Video displays for gaming, simulators, and military systems are examples. Sample rates of several hundred million per second for a 16-bit DAC are possible but 14-bit and even 12-bit are used in addition to lowering the sample rate in order to alleviate the high cost of such devices.

FIG. 3 illustrates a typical 12-bit, high speed DAC of the present art and is provided to illustrate the general type and amount of circuitry present in this type of device. An 8-bit device would be similar but have 4 fewer sections in the portion not shown. A DAC may have either a voltage or current output. Complementary voltage outputs are the most common although a single output may be provided for applications internal to an integrated circuit providing additional functionality. A current output DAC will typically have differential outputs with output current miss-match held below a specified upper limit. The output currents will not be identical and the output circuitry normally includes either impedances from each to ground or other means to accommodate the imbalance.

FIG. 4 illustrates an example 400 of a typical application of a high resolution, high speed, current output DAC. DAC U401 is coupled to Digital Signal Source 100 at nodes N401 through N415 and N417. Nodes N401 through N414 couple the digital data inputs. The digital clock is coupled at node N415. A power down control signal is coupled at node N417. A power down signal is a typical input control among several possible control signals that are common to DAC circuits in general.

One of the common features for this type of application is the use of one or two resistors to set the full-scale output signal level, which is a current level in example 400. Current setting resistor R401 is coupled to DAC U401 at node N418. DAC U401 possesses another common feature, an internal reference with an option of utilizing an external one. The internal reference is selected by coupling the selection pin to ground at node N420. Capacitors C401 and C404 function as bypass noise filter capacitors. Capacitor C401 couples the external reference input pin to ground at node N419, and capacitor C404 couples the bypass connection to ground at node N427.

Another common feature of DACs is the use of separate power and ground returns for the digital and analog portions of the DAC. In example 400, DAC U401 is coupled to analog power A401 at node N422, to digital power D401 at node N423, to analog ground AGND401 at node N421 and to digital ground DGND401 at node N424. The use of separate digital and analog power and ground circuits helps to reduce distortion of the analog output due to coupling of digital switching noise onto it through the power and ground connections internal to the DAC integrated circuit. Power supply filtering and bypass capacitors are not shown. External to DAC U401, the digital ground and analog ground may be connected to a common ground plane or maintained separately. Analog and digital power connections typically will have separate filtering and bypass capacitors even if the DAC operates from a single supply voltage.

Operating bandwidth of DAC U401 is limited by external capacitor C402 operating in conjunction with circuitry internal to DAC U401. Capacitor C402 couples the Bandwidth Limit control input at node N416 to analog power input A401 at node N422.

Capacitor C405 and resistor R403 couple the non-inverting output at node N425 to ground at node N421. Capacitor C403 and resistor R402 couple the inverting output at node N426 to ground at node N421. Capacitors C403 and C405 are small and function to filter any clock signal and any of its harmonic signals from the output waveform. Clock feed-through can be a major system problem and require much more sophisticated filtering and control methods to remove it without distorting the analog output signal. Resistors R402 and R403 accommodate a minimum current flow and are the least sophisticated method of limiting the impact of any current imbalance between the complimentary outputs. Since the output impedance of the DAC is typically a couple of hundred thousand ohms, R402 and R403 values should be selected to avoid significant movement of the output, offset voltage from ground. For particular applications, said values can range up to several megohms but are typically much smaller.

Transformer T401 couples the output of DAC U401 to the analog load block 120. The transformer primary couples the non-inverting output of DAC U401 at node N425 to the inverting output at node N426. The secondary of transformer T401 couples the input to the analog load at node N428 to the analog input return at node N429. Use of coupling transformer T401 insures that the currents driving the load are the same from each output of DAC U401. Care should also be taken so that the transformer itself does not introduce significant distortion in the output waveform.

FIGS. 5 through 14 are illustrations of DAC outputs of the present art and the generic forms and relative amounts of distortion present as a function of the number of bits of resolution and the number of sample time points per cycle. Said figures further provide a basis for comparison to the reduced distortion outputs of embodiments of the present invention with comparable resolution and sample rate.

FIG. 5 illustrates a simple, single frequency sine wave plus a dc component. Although most waveforms are complex combinations of multiple sine waves and the presence of multiple frequencies and phases can exacerbate distortion, a single cycle is used for visual clarity. The presence of a dc offset also complicates the illustrations and understanding. For example, in FIG. 5, all of the rectangular sample bars are exclusively positive whereas in FIG. 6, they are both positive and negative as would generally be expected in a sine wave. Since removal and restoration of a dc offset is almost always a simple process, a single frequency sine wave without a dc component, as shown in FIG. 6, is used in subsequent illustrations. The number of sample time points per cycle in FIGS. 5 and 6 is 34. Although many applications use a much higher rate, a rate of 34 per cycle would be within the normal sampling range for both high-resolution audio and high frequency video applications. A sample rate of 34 per cycle is used except where the rate is being varied to illustrate the impact of such variation.

FIGS. 7 through 12 illustrate the effects of the number of bits of resolution used to form the analog signal. FIG. 7 illustrates a representation of the reference sine wave for a 1-bit DAC. FIG. 8 illustrates the envelope of the clocked output signal. The output signal is severely distorted with various forms of distortion apparent in the illustration. Most prominent is the deviation during the period wherein the value of the sine wave has yet to exceed the threshold for the next bit. It should be noted that the reference sine wave and the output signal do not coincide until after the sine wave has peaked. There is also a small time delay or phase shift distortion.

FIG. 9 illustrates a representation of the reference sine wave for a 2-bit DAC, and FIG. 10 illustrates the envelope of the output signal. Comparing FIG. 9 to FIG. 7 and FIG. 10 to FIG. 8, the distortion is reduced. The maximum transition step size is smaller, and the deviation that occurs before the reference sine wave crosses the threshold value for the next bit transition is reduced. The time delay and phase shift are also smaller although they typically will not pose problems as significant as amplitude distortion.

FIG. 11 illustrates a representation of the reference sine wave for a 5-bit DAC, and FIG. 12 illustrates the envelope of the output signal. Comparing FIG. 11 to FIG. 9 and FIG. 12 to FIG. 10, the distortion is further reduced with the increased number of bits. The maximum transition step size is again smaller, and the deviation that occurs before the reference sine wave crosses the threshold value for the next bit transition is reduced. The time delay and phase shift are also smaller. A further increase in the number of bits continues to reduce signal distortion but except for an enlargement of a small area of a waveform, visual illustration becomes impractical. Such an enlargement can be seen in FIG. 19B, and although the magnitude of the distortion is greatly reduced, its form remains largely unchanged until the magnitude of a bit is less than the noise floor of the system.

FIG. 13 illustrates the distortion that may be introduced in the output waveform by the sample rate of the digital input signal. FIG. 14 illustrates the envelope of the output waveform. Note the asynchronous relationship between the output signal and the sample clock. This is the more general case. The digital input from which the waveform is generated has 7 samples per cycle, just under over one fifth of that in FIG. 6. This is more than 3 times the Nyquist criterion so that all of the information necessary to reproduce the sine wave is theoretically available. Signal distortion is of the same form as that associated with the number of bits of resolution. Both the time delay and phase distortion are more sensitive to a relatively low number of samples per cycle than to a relatively low number of bits per sample.

The obvious result is that low distortion representation of a signal is best achieved with a very large number of bits per sample and a very large number of samples per cycle at the maximum frequency component of interest in the signal. In addition, the DAC should be designed for low harmonic and inter-modulation distortion resulting from the non-linear characteristics of individual circuit components. These results may be somewhat obvious and DAC manufacturers have applied new designs and processes to increase DAC capabilities in both respects. The major difficulty is cost that can increase exponentially as the state of the art in speed is approached.

SUMMARY OF THE INVENTION

The present invention is an electronic, digital-to-analog converter circuit that converts one or more clocked, digital input signals into an analog output signal, where the ideal transitions of the output signal between clocked changes in the digital input signal are either substantially linear or spline curves as opposed to the usual step transitions in DAC circuits of the present art.

In one or more embodiments, the present invention includes at least one sub-circuit that contains a current output DAC of the present art that has step transitions in its outputs. Such sub-circuits are hereafter referred to as a DAC sub-circuits.

In one or more embodiments, the present invention includes at least one DAC sub-circuit wherein said current output DAC is comprised of a voltage output DAC followed by a voltage-to-current conversion circuit.

In one or more embodiments, the present invention contains a single DAC sub-circuit, and generates an analog output signal from a digital input signal, applied to the input of said DAC sub-circuit, where said digital input signal comprises the first derivative of the desired output signal, and wherein said analog output signal is generated by integration of the current output of said DAC sub-circuit.

In one or more embodiments, the present invention uses one or more capacitors to integrate the current output of one or more DAC sub-circuits.

In one or more embodiments, the present invention includes more than one DAC sub-circuit and in which each DAC sub-circuit output current is weighted and combined before being integrated to produce the output signal.

In one or more embodiments, the present invention includes more than one DAC sub-circuit configured such that the number of useable bits of resolution is greater than the number of bits of resolution for any DAC contained in said individual DAC sub-circuits.

In one or more embodiments, the present invention includes means to feedback a digital representation of the output signal to the digital signal source to permit comparison of the actual output signal with the desired output signal.

In one or more embodiments, the present invention includes means to feedback a digital representation of the output signal of each DAC sub-circuit to the digital signal source to permit comparison of the actual output signal with the desired output signal.

In one or more embodiments, the present invention includes means to switch the input to individual feedback paths from the point of detection of the signal being fed back to ground.

The present invention provides the ability to convert digital signals to analog signals and simultaneously achieve high sample rates, high bit resolution, and lower distortion analog output signals, at lower cost than the present state of the art devices.

BRIEF DESCRIPTION OF THE DRAWINGS

FIG. 21A is an illustration of the shape of typical positive and negative transitions, without overshoot, for the analog output signal for a DAC of the present art.

FIG. 21B is an illustration of the shape of typical positive and negative transitions, without overshoot, for the analog output signal for a DAC of the present art having faster output slew rate than the DAC in FIG. 21A.

FIG. 22A is an illustration of one implementation of a single segment of a piecewise linear approximation of a non-linear waveform.

FIG. 22B is an illustration of an alternate implementation of a single segment of a piecewise linear approximation of a non-linear waveform.

FIG. 22C is an illustration of another alternate implementation of a single segment of a piecewise linear approximation of a non-linear waveform.

FIG. 22D is an illustration of another alternate implementation of a single segment of a piecewise linear approximation of a non-linear waveform.

FIG. 22E is an illustration of two segments of the implementation of a piecewise linear approximation of a non-linear waveform shown in FIG. 22D.

FIG. 22F is an illustration of a four sample-point match, spline approximation of a non-linear waveform segment.

FIG. 22G is an illustration of a three sample-point match, spline approximation of a non-linear waveform segment with a two sample-point match (linear) and the four sample-point match approximation of FIG. 22F superimposed for comparison purposes.

DETAILED DESCRIPTION OF THE INVENTION

The present invention is directed to digital to analog signal converters and digital signal synthesizers. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention. Except as noted herein, common components and connections, identified by common reference designators function in like manner in each circuit.

The present invention is a digital to analog converter circuit that provides significantly lower distortion than achieved by digital to analog converter circuits of the present art having comparable speed and resolution. The present invention provides linear or higher order transitions between clock transition time points rather than the step transitions of the present art. Distortion reduction can exceed 30 dB in one embodiment with linear sample-to-sample transitions and greater in alternate embodiments with non-linear transitions. In other embodiments, the present invention can provide low distortion at resolutions from 16 to 24 bits or more at sample rates typical of high-speed 8-bit devices of the present art.

Figure 23A:
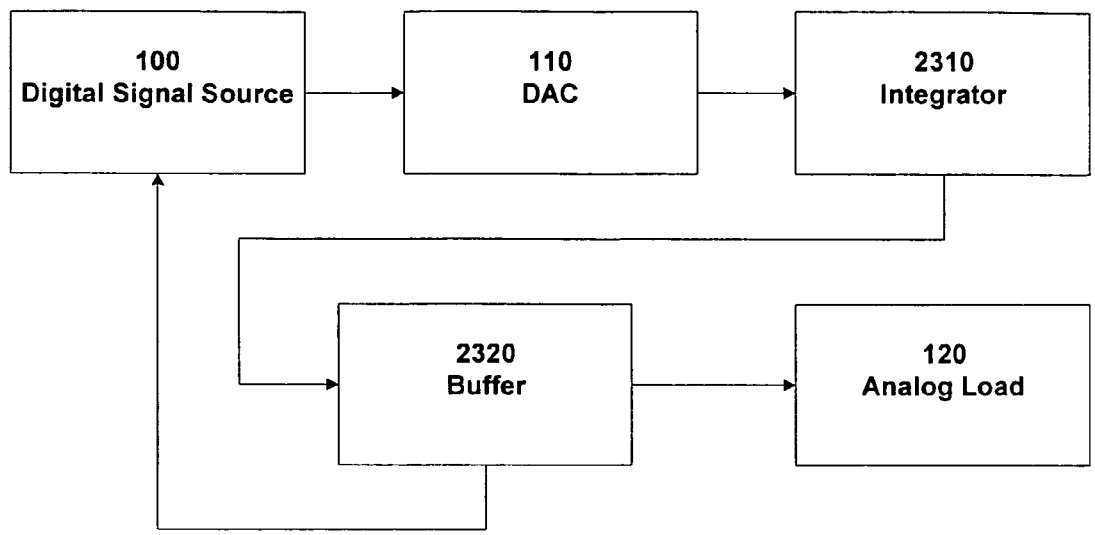
FIG. 23A is a block diagram illustrating functionality implementation of an embodiment of the low distortion DAC of the present invention using a current output DAC of the present art.

FIG. 23A is a functional block diagram for a generic embodiment of the present invention and illustrates the major differences between embodiments of the present invention and digital to analog converters of the present art. The presence of integrator 2310 implies that at least a portion of input signal(s) to DAC 100 should represent the first derivative of the desired output signal, which is then integrated to realize said analog output signal. In conventional DAC circuits of the present art, the digital input signal is a direct, digital representation of the desired output signal.

The use of feedback, shown in FIG. 23A as signal flow from buffer 2320 to digital signal source 100 provides another key to simultaneous realization of high resolution and high speed at low cost. Feedback coupled with gain sources within the loop allow for high precision realization of the output signal while avoiding settling time issues that limit high resolution, high speed DACs of the present art.

Digital Signal Source Block

Digital signal source 100 can perform a wide variety of functions that depend on the overall system configuration and then the complexity and details of any specific embodiment. For an open loop configuration such as embodiment 2400 illustrated in FIG. 24, digital signal source 100 provides the data and control signal inputs. The simplest form for digital signal source 100, which constitutes an addressable interface to a data bus carrying said signals, can be employed for embodiment 2400 as can more complex forms. A dedicated, onboard digital signal processor (DSP) with adequate memory for look-up tables and independent signal processing capability is preferred for high performance, integrated embodiments. This also simplifies the processes of loading data and providing look-ahead capability.

The ability of digital signal source 100 to arbitrarily scale the input signal(s) to DAC sub-circuit(s) is a significant source of gain for the invention. This coupled with the use of feedback wherein the DSP is within the feedback loop represent critical enabling technology for achievement of high resolution, high-speed digital to analog converters of the present invention.

DAC Block

DAC 110 performs the digital to analog signal conversion and can be configured in a variety of ways to realize the capabilities and requirements for specific applications. The invention uses DAC sub-circuits of the present art as component parts in the realization of a digital to analog converter system with significantly greater capability than can be achieved with the present art. Presently, DACs are commonly available up to 16 bits at relatively high speeds, but only up to 8–10 bits for very high speed. Common limitation for the number of bits is 8 to 10 for individual DAC sub-circuits, and realization of higher resolution is achieved by stacking these lower resolution devices. Feedback and gain adjustment can be employed to generate error correction signals that can be added to the output of DAC sub-circuits to provide the accuracy and precision of the higher resolution and speed than is achievable with the present art. Where employed, error correction DAC sub-circuits are functional parts of DAC 110 and have their own input signals that compensate for drift and offset.

Figure 23B:
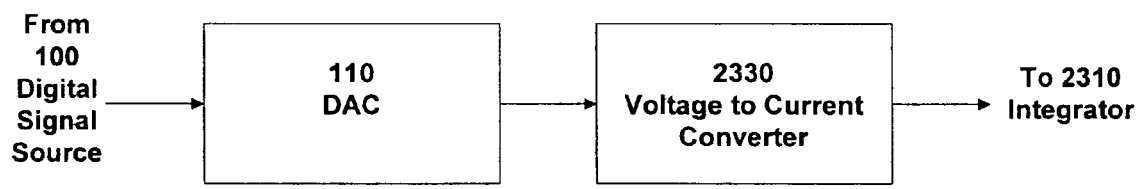
FIG. 23B is a block diagram illustrating an alternate implementation of DAC 110 in FIG. 23A using of a voltage output DAC of the present art in place of the current output DAC of the present art.

Current output DAC sub-circuits are preferred since they allow integrator 2310 to be implemented in the form of a single capacitor. FIG. 23B represents one alternate implementation for use of voltage output DAC sub-circuits of the present art instead of preferred current DAC sub-circuits.

Integrator

Integrator 2310 represents a key identifying characteristic of the present invention. The preferred embodiment enabled by use of current output DAC sub-circuits in DAC 110, is the use of integrating capacitors to perform the function for this block. Alternate embodiments employ analog integrators to perform this function, at the cost of added circuit complexity and cost.

Buffer

Figure 31:
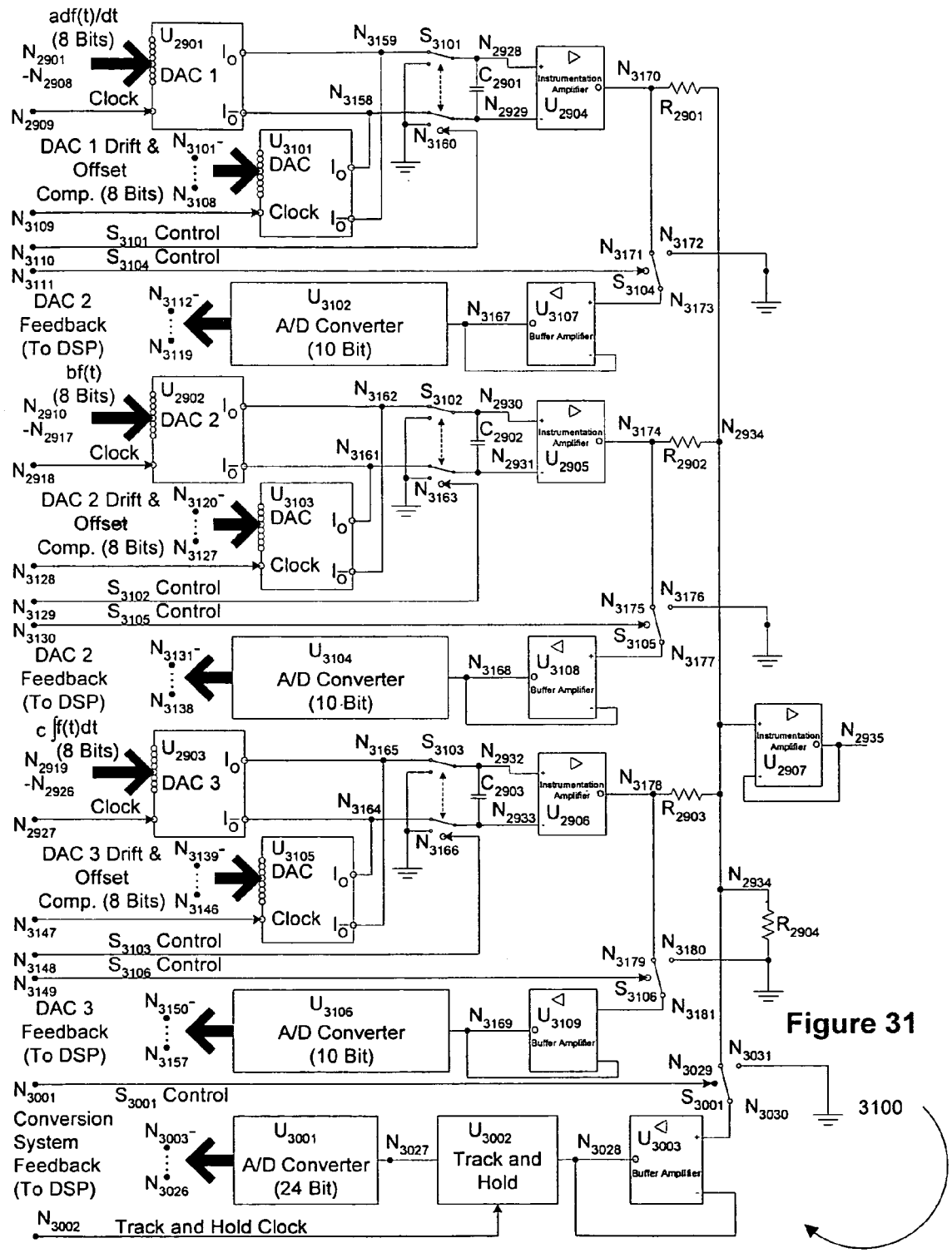
FIG. 31 is preferred embodiment of the low distortion DAC of the present invention with enhanced bit resolution, multiple current integrating capacitors, and multiple feedback signals to the digital signal source.

Buffer 2320 is a catchall function that can vary considerably in complexity for different embodiments. At a minimum, buffer 2320 provides isolation of the output signal of integrator 2310 from external signal sources, particularly those arising from analog load 120. In the embodiment illustrated in FIG. 24, the buffer comprises instrumentation amplifier U2401, resistor R2401 and a few miscellaneous components not shown such as bypass filter capacitors. In more complex embodiments such as illustrated in FIG. 31, buffer 2320 can also include means for generation of multiple feedback signals including multiple A/D converters, track and hold circuits, summing resistor networks, switches for controlling operation and calibration modes, as well as multiple isolation or true buffer amplifiers.

Analog Load Block

Analog load 120 comprises "all" of the downstream circuitry and signal transmission media to which the analog output signal(s) from the overall DAC are passed. As such, analog load 120 can comprise an almost unlimited variety of possible configurations and is not truly part of the present invention. However, the specific form of analog load 120 for a specific application can have a profound impact on the general design of the DAC system of the present invention and on the detail design of buffer 2320. Analog load 120 may be the final stage of a system such as a display or it may be a transmission stage to subsequent stages. Within analog load 120 or subsequent circuit stages, the DAC analog output signal may be converted to a digital format using an A/D converter.

Voltage Output DAC

The preferred implementation for various embodiments of the present invention utilizes current output DAC sub-circuits. The current output allows direct integration by a capacitor. Among DAC types of the present art, voltage output DACs significantly outnumber those with current outputs. This implies that if a particular type of input control is desired for a specific application, it is far more likely to be found in a voltage output DAC than a current output type. Typically where the desired functionality is available in a voltage output DAC, said voltage output DAC sub-circuit should be utilized for DAC 110 and a voltage to current converter 2330 added between the output of DAC 110 and the input of integrator 2310 as illustrated in FIG. 23B.

Voltage to Current Converter

As discussed above, voltage to current converter 2330 allow the use of voltage output DACs for DAC 110 while retaining the capability to use simple capacitors to perform the function of integrator 2310. Because of the wide variety of applications, potential requirements and constraints on such converter circuit, and the availability of simple implementations that can perform the voltage to current converter function in a wide variety of common applications, it is not necessary to illustrate said converter circuit. If an alternative approach is desired, voltage output of DAC 110 sub-circuit can be applied to a true integrator circuit provided means are included to prevent a high gain integrator from exceeding the dynamic range of the overall circuit function and output signal.

Low Distortion DAC Circuit

Figure 13:
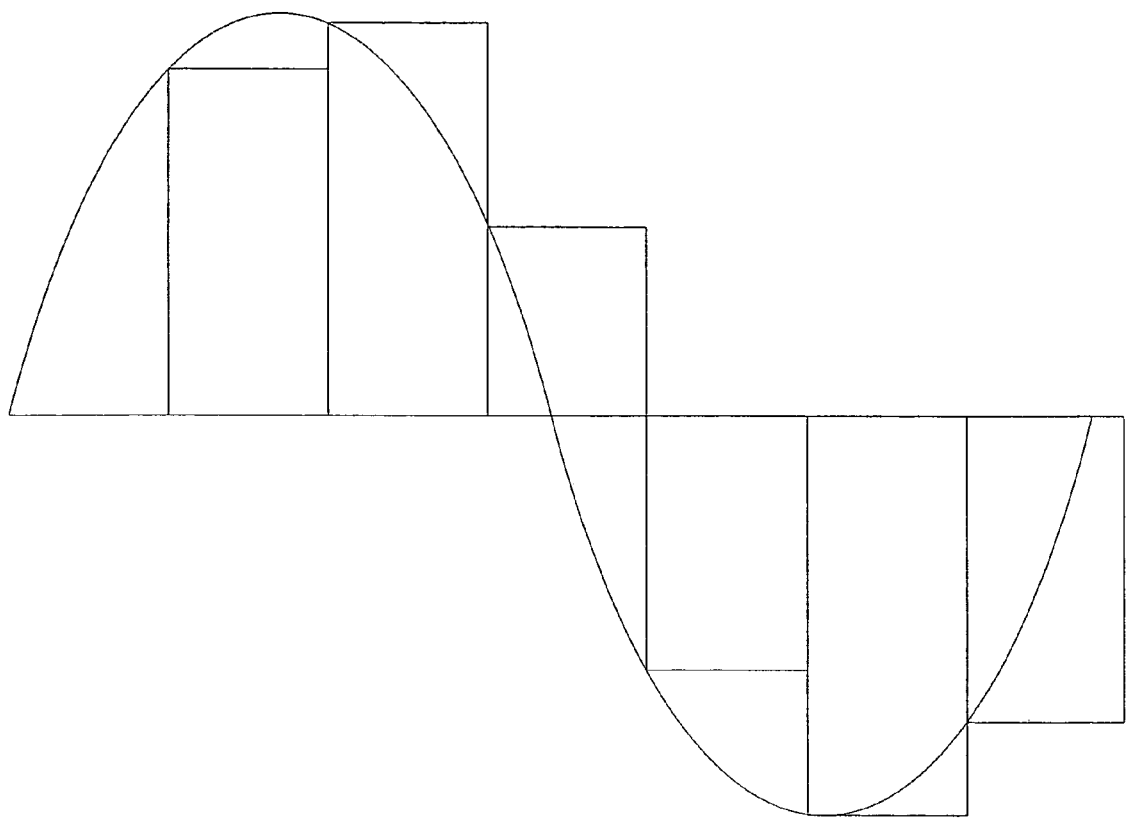
FIG. 13 is an illustration showing a digital, 10-bit (or greater) resolution, 6 samples per cycle representation of one cycle of the reference sine wave of FIG. 6. The sine wave being represented is also shown for convenient comparison.
Figure 14:
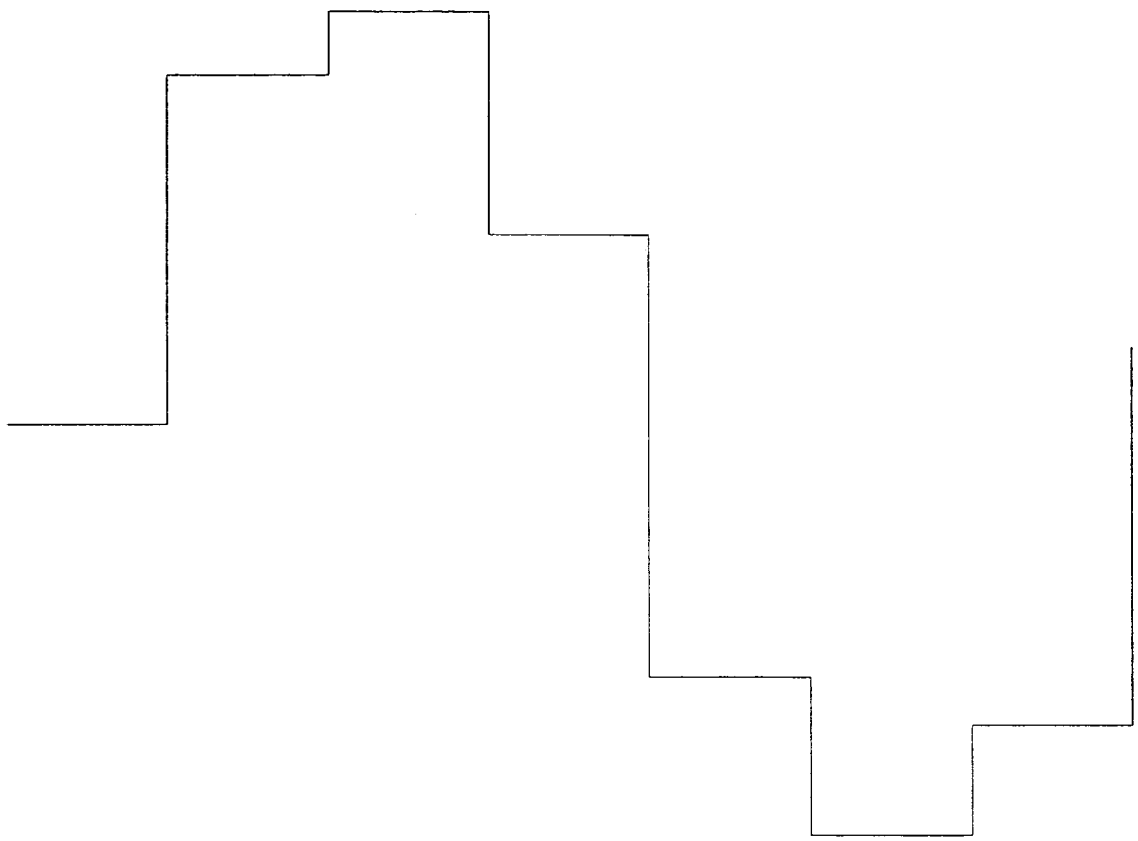
FIG. 14 is an illustration showing an isolated view of the digitized signal of FIG. 13.
Figure 15:
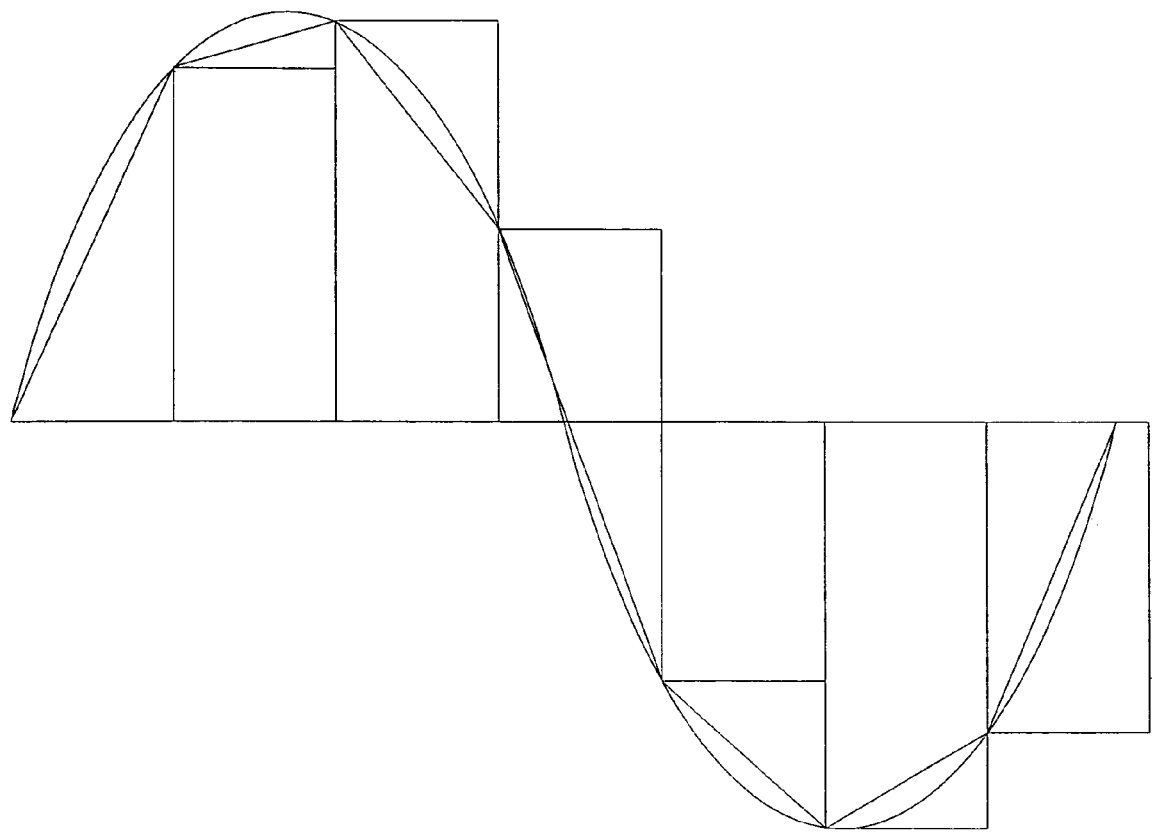
FIG. 15 is an illustration of the linear transitions produced by one or more embodiments of the present invention superimposed on the waveforms illustrated in FIG. 13.
Figure 16:
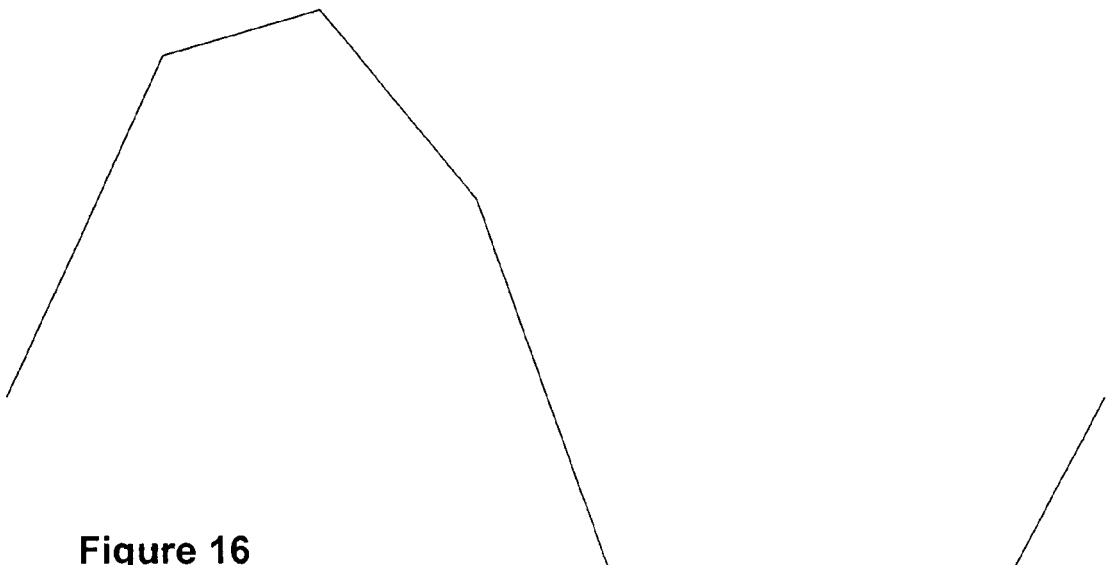
FIG. 16 is an illustration showing an isolated view of the output waveform with linear transitions illustrated in FIG. 15.
Figure 17:
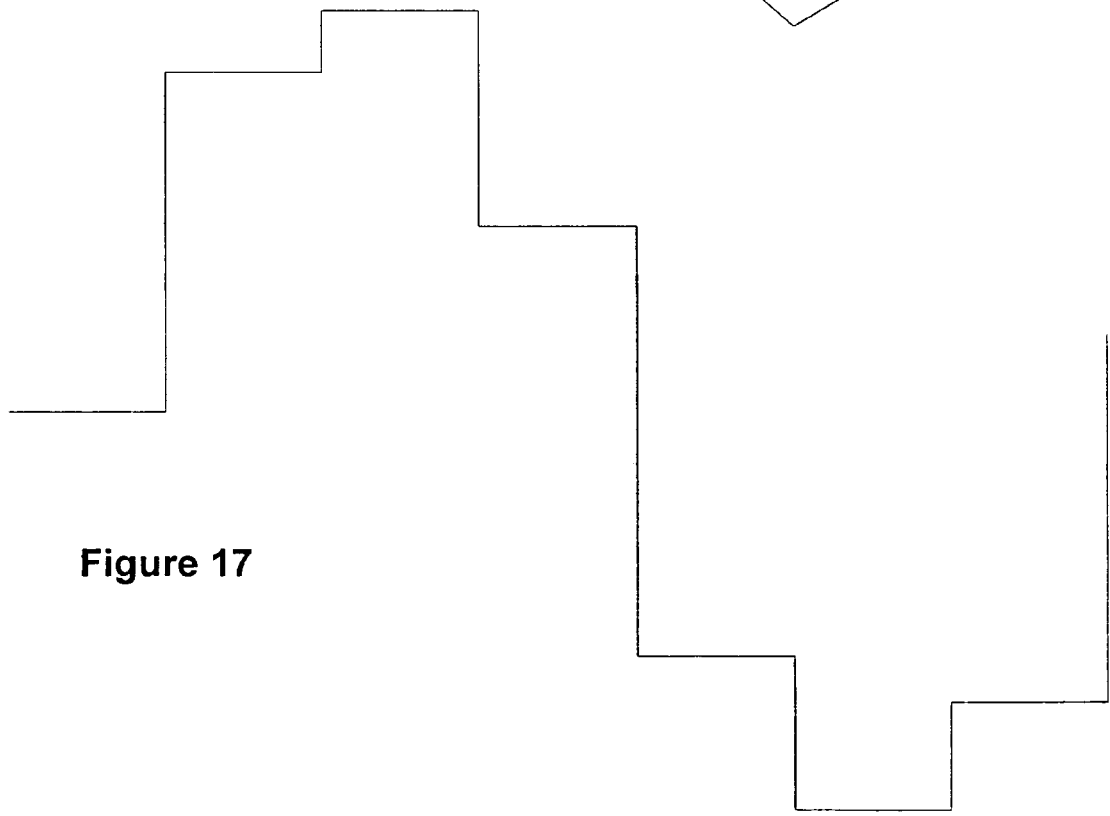
FIG. 17 is an illustration of the waveform of FIG. 14, aligned with FIG. 16 to facilitate visual comparison of the waveforms.
Figure 18:
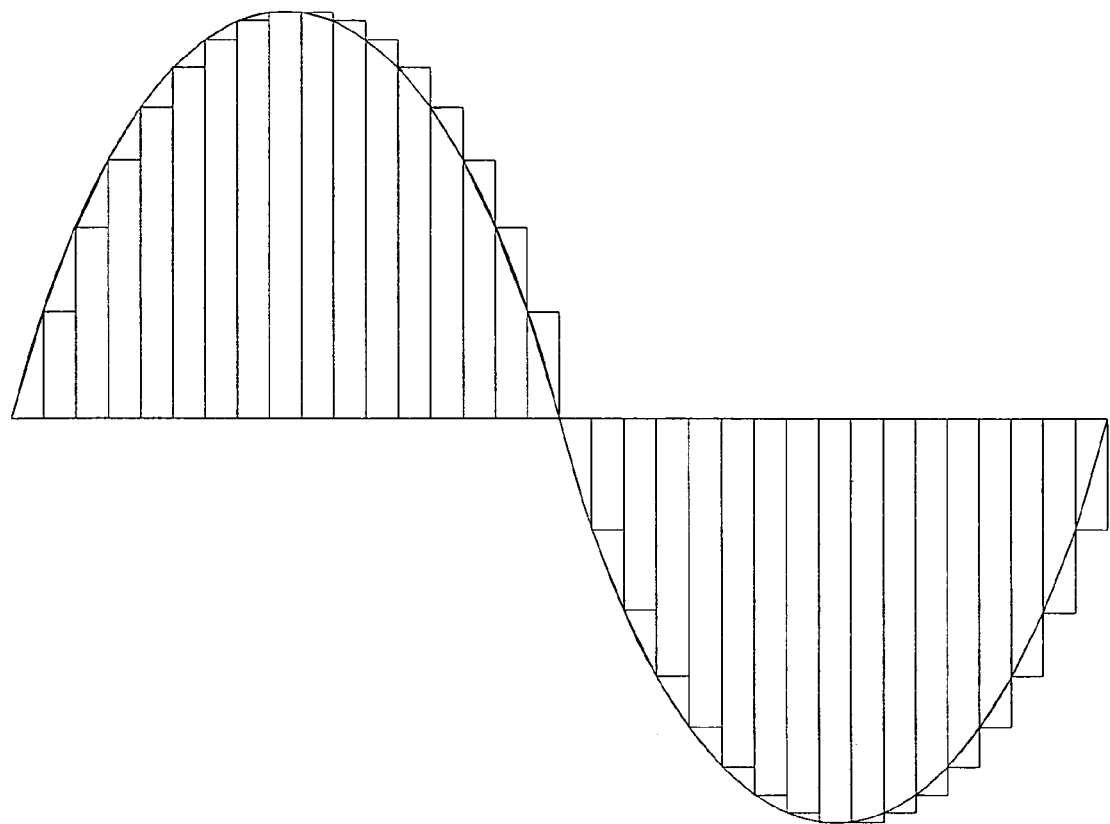
FIG. 18 is an illustration for a 10-bit (or greater) resolution, 34 samples per cycle, piece-wise linear approximation of one cycle of the output waveform in accordance with one or more embodiments of the present invention superimposed with the reference sine wave and the output of a DAC of the present art.
Figure 19:
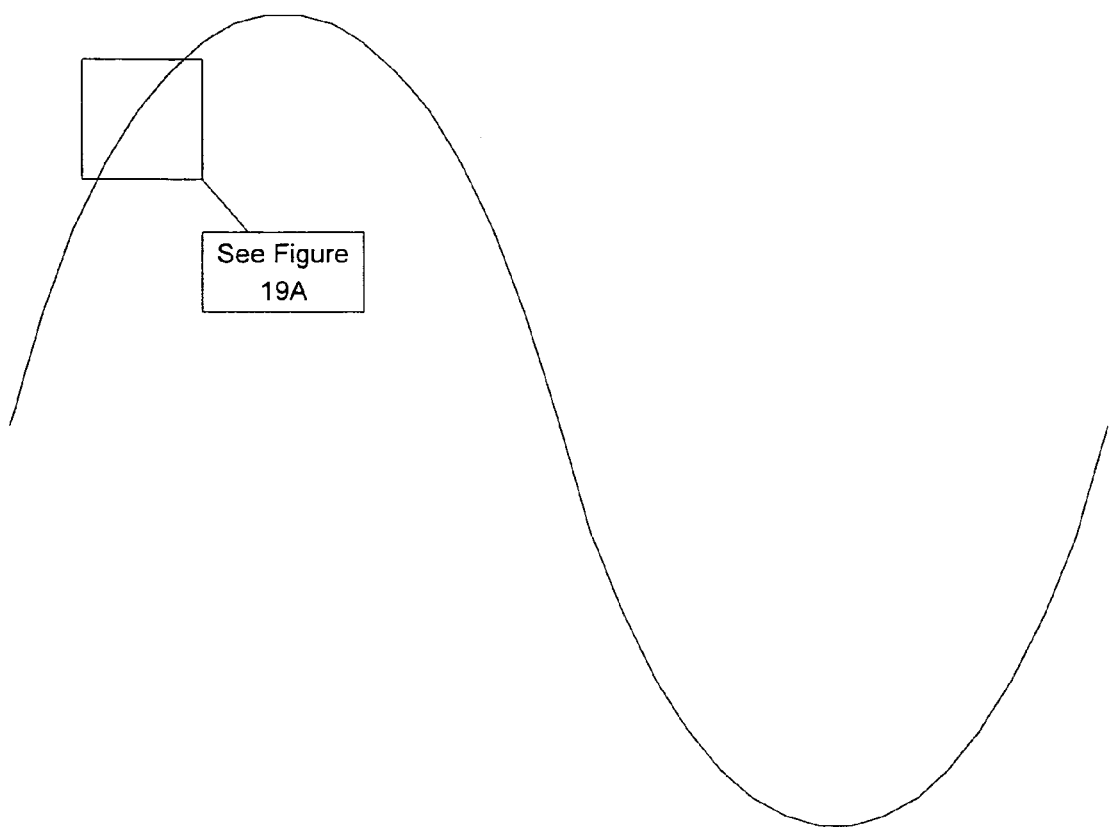
FIG. 19 is an illustration showing an isolated view of the output waveform shown in FIG. 18 in accordance with the present invention.
Figure 19A:
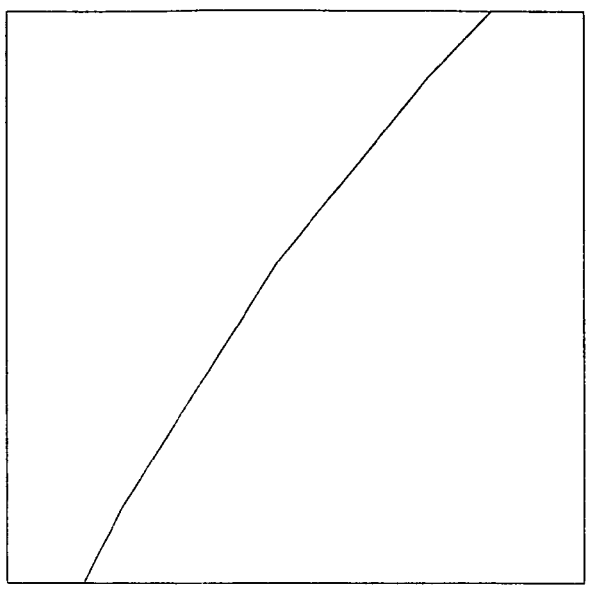
FIG. 19A is an illustration of an enlarged portion of the waveform in FIG. 19.
Figure 19B:
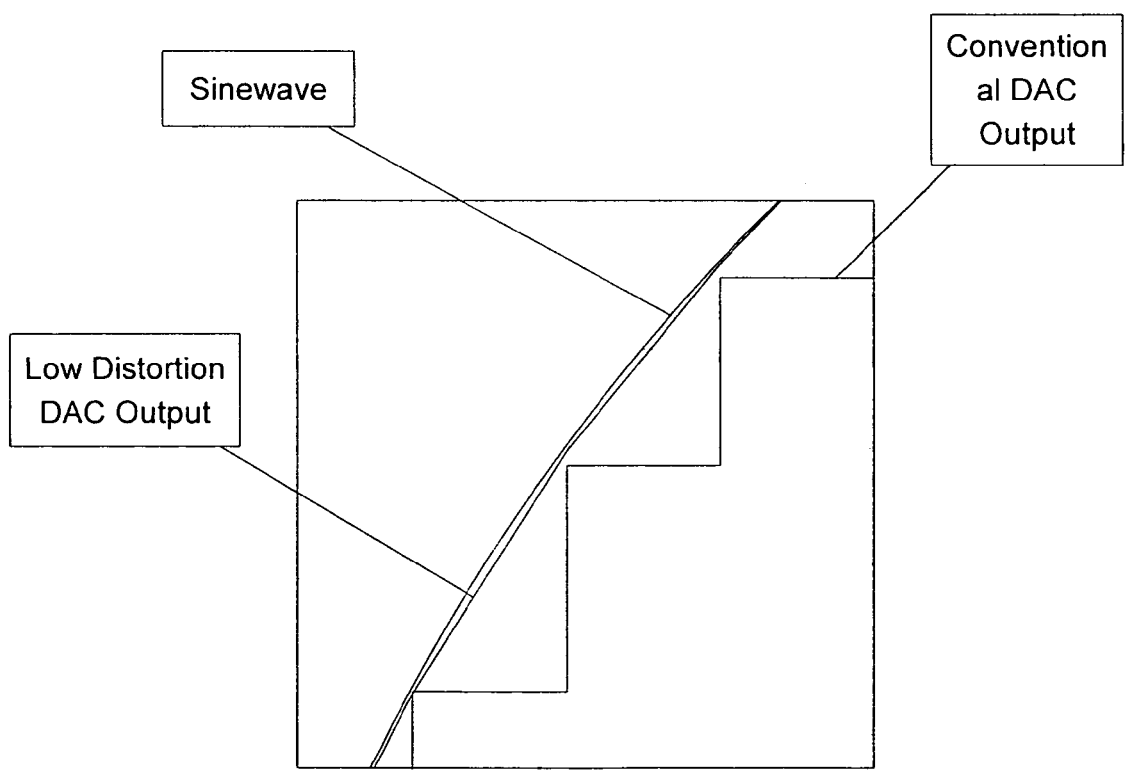
FIG. 19B is an illustration of the waveform of FIG. 19A with superimposed comparable portions of the reference sine wave and the output waveform of a DAC of the present art.
Figure 24:
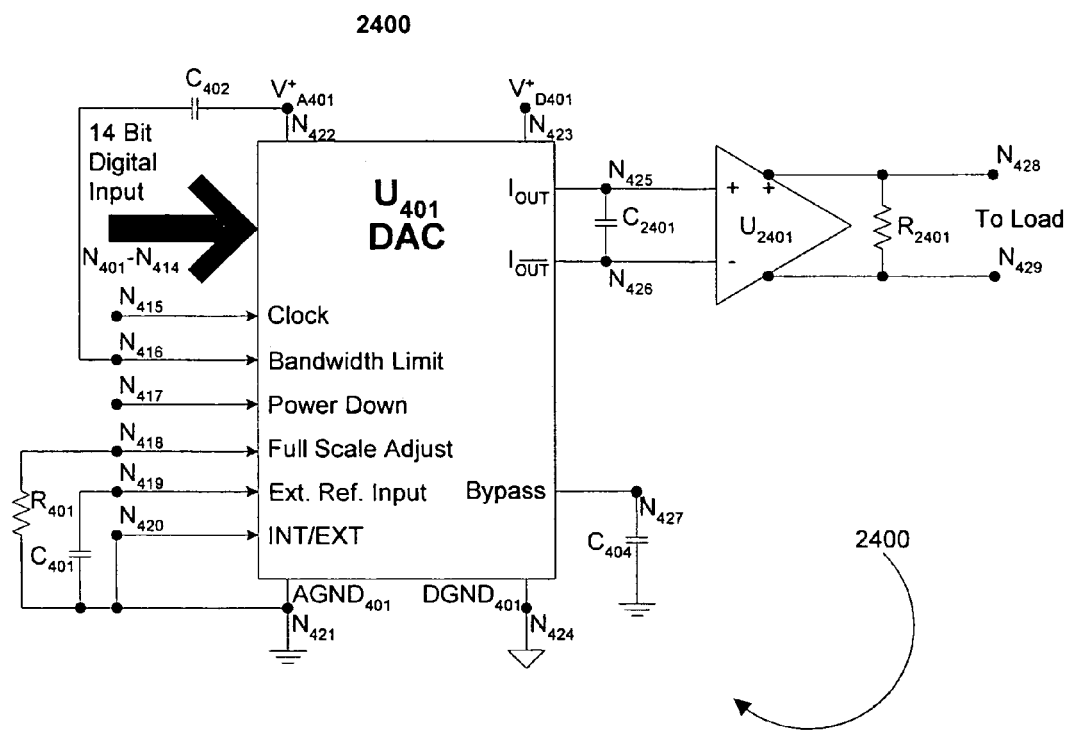
FIG. 24 is an embodiment of the low distortion DAC of the present invention.

FIG. 24 illustrates an embodiment 2400 of the present invention that provides a linear rather than a step transition in the analog output signal between consecutive clock time points. This corresponds to a two-point curve fit of the form illustrated in FIG. 22A. The desired transition waveform is illustrated in FIG. 15 superimposed on the comparable transition for a DAC of the present art illustrated in FIG. 13. The output signals are shown in proper alignment for embodiment 2400 and DAC application 400 in FIGS. 16 and 17 respectively, where the waveform of FIG. 16 is a far superior, lower distortion representation of a sine wave. Comparative waveforms including reference sine wave for the higher sample rate per cycle is illustrated in FIG. 18. An isolated view of the output waveform of the present invention in FIG. 18 is shown in FIG. 19. FIG. 19A shows a blow-up of a small section of FIG. 19 with visible point-to-point line segments that form the curve. The reduced signal distortion benefit of the present invention compared to the present art can be clearly seen by comparison of their respective outputs in FIGS. 19 and 20.

Figure 20:
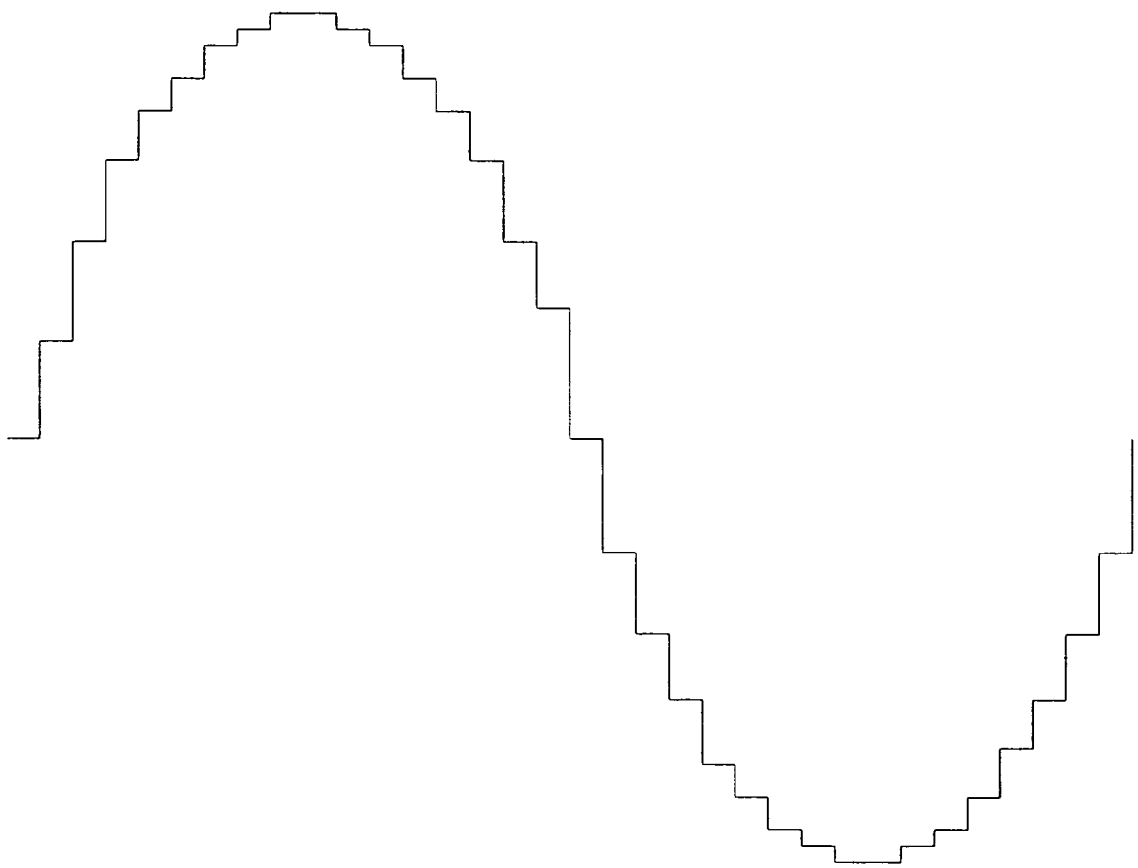
FIG. 20 is an illustration showing an isolated view of the output waveform of FIG. 18 for a DAC of the present art.

In addition to the distortion produced by step transitions as seen in FIG. 20, there are additional subtle aspects of the step transition that affect the output signal fidelity. Overshoot and ringing in step transitions can vary considerably in size and duration and create a wide variety of negative impacts. FIG. 21A illustrates properly damped, step transitions in both positive and negative directions. Clearly, positive and negative, non-linear transitions have different instantaneous spectral content and contribute significantly to the baseline noise level. While present, the noise generated including higher harmonics can couple into other lines and circuits, particularly impacting those with frequency components above the waveform being generated by the DAC of the present art. Faster transitions as illustrated in FIG. 21B will change the instantaneous spectral energy distribution and even reduce the transition time in which transition noise generated can couple into other lines and circuits, but does not eliminate the problem. Linear transitions of the present invention will significantly mitigate this potential problem.

Figure 1:
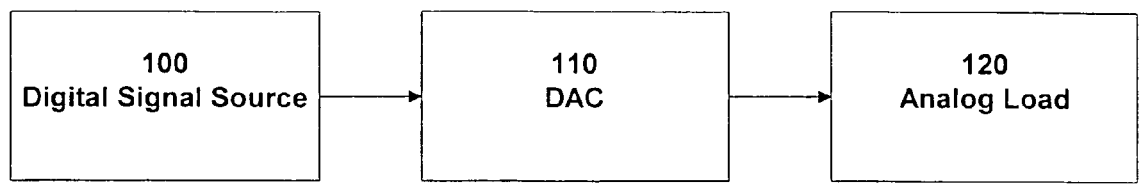
FIG. 1 is a block diagram of a typical application of a DAC.
Figure 2:
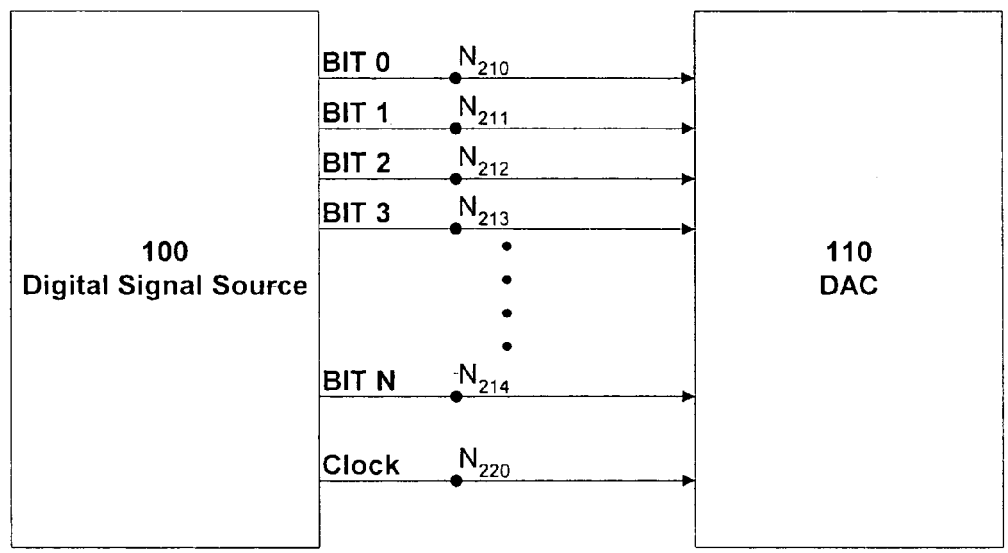
FIG. 2 is a block diagram of the minimum, digital signal source to DAC interface.
Figure 3:
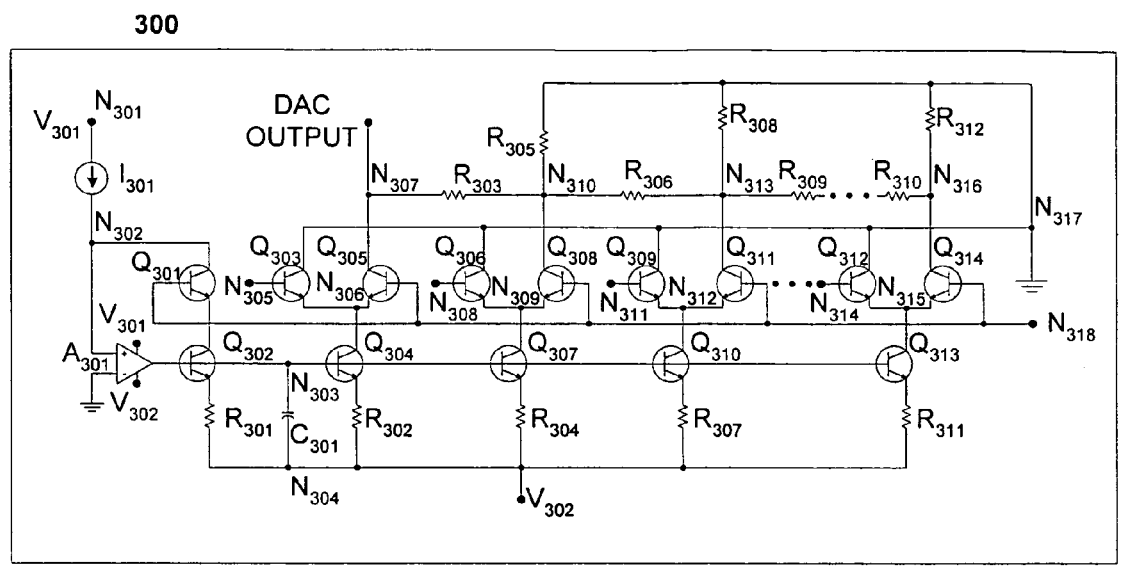
FIG. 3 is a circuit diagram of a 12-bit, high speed DAC.
Figure 4:
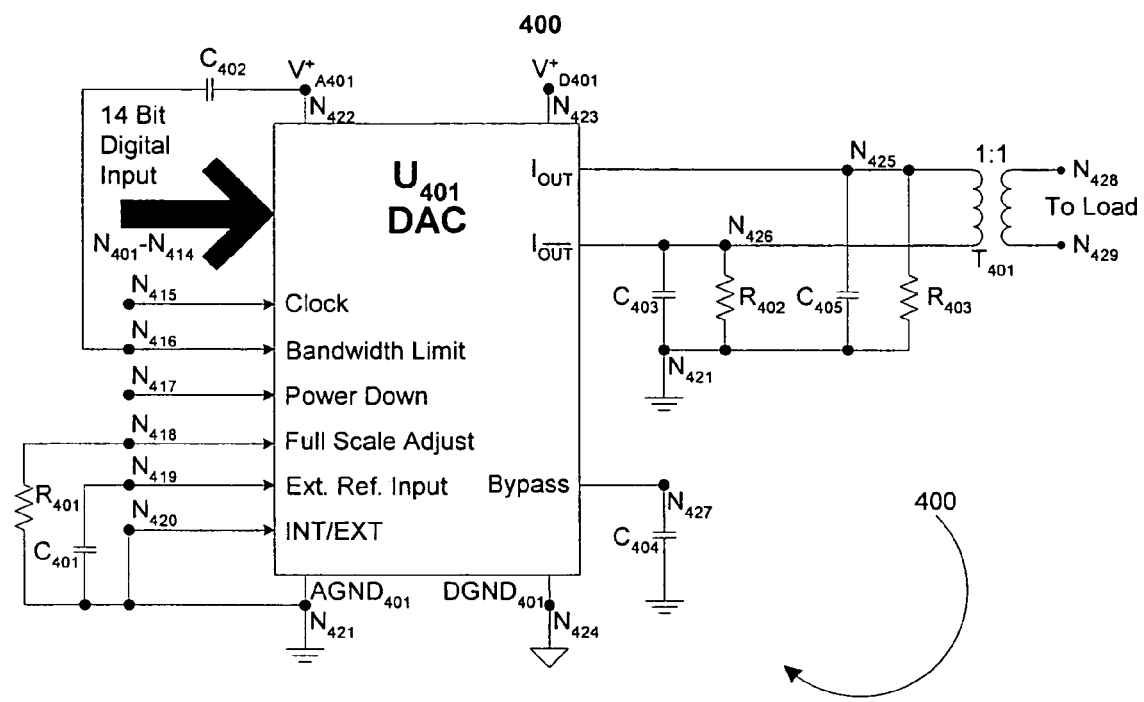
FIG. 4 is a circuit diagram of a typical, monolithic, current output DAC.
Figure 5:
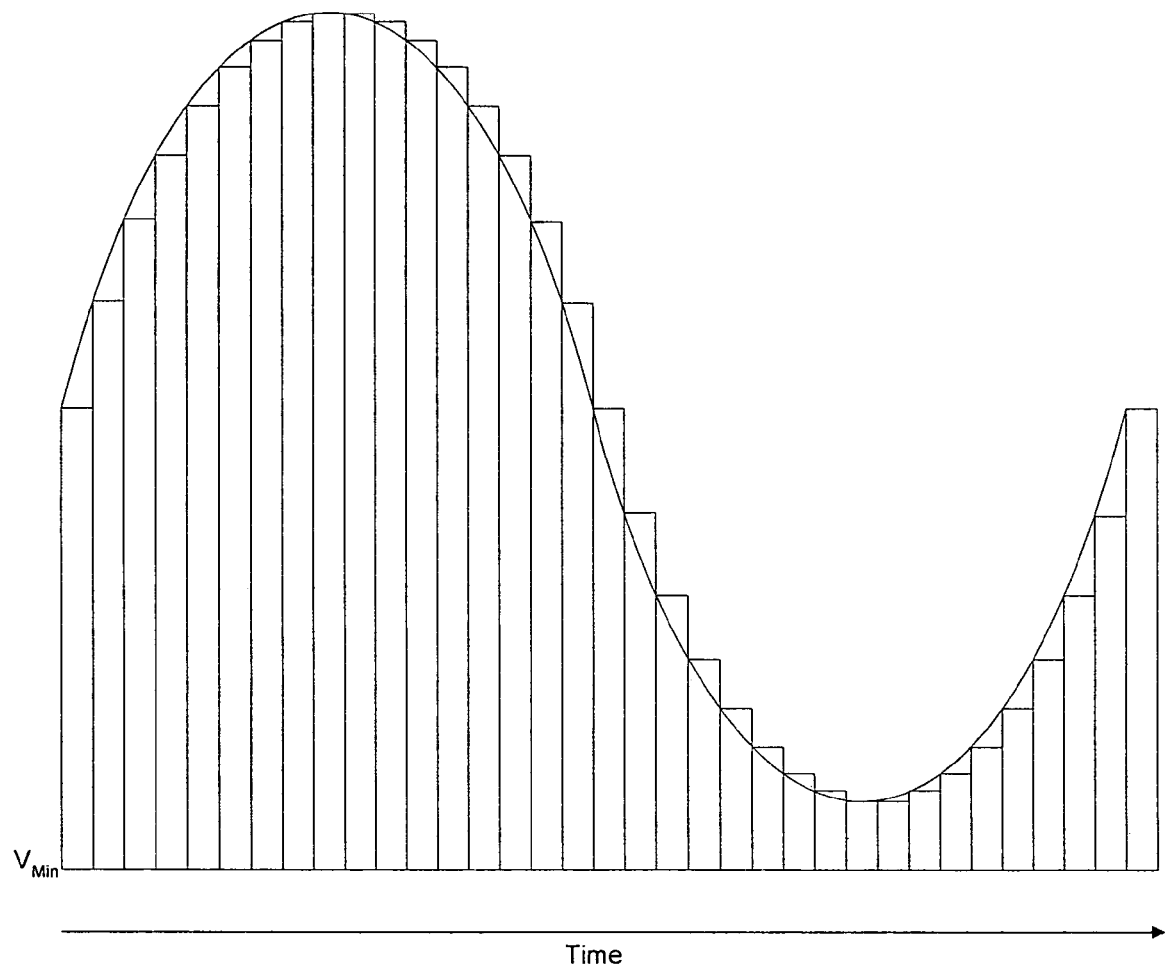
FIG. 5 is an illustration showing a digital, 10-bit (or greater) resolution, 34 samples per cycle representation of one cycle of a sine wave with DC offset. The sine wave being represented is also shown for reference.
Figure 6:
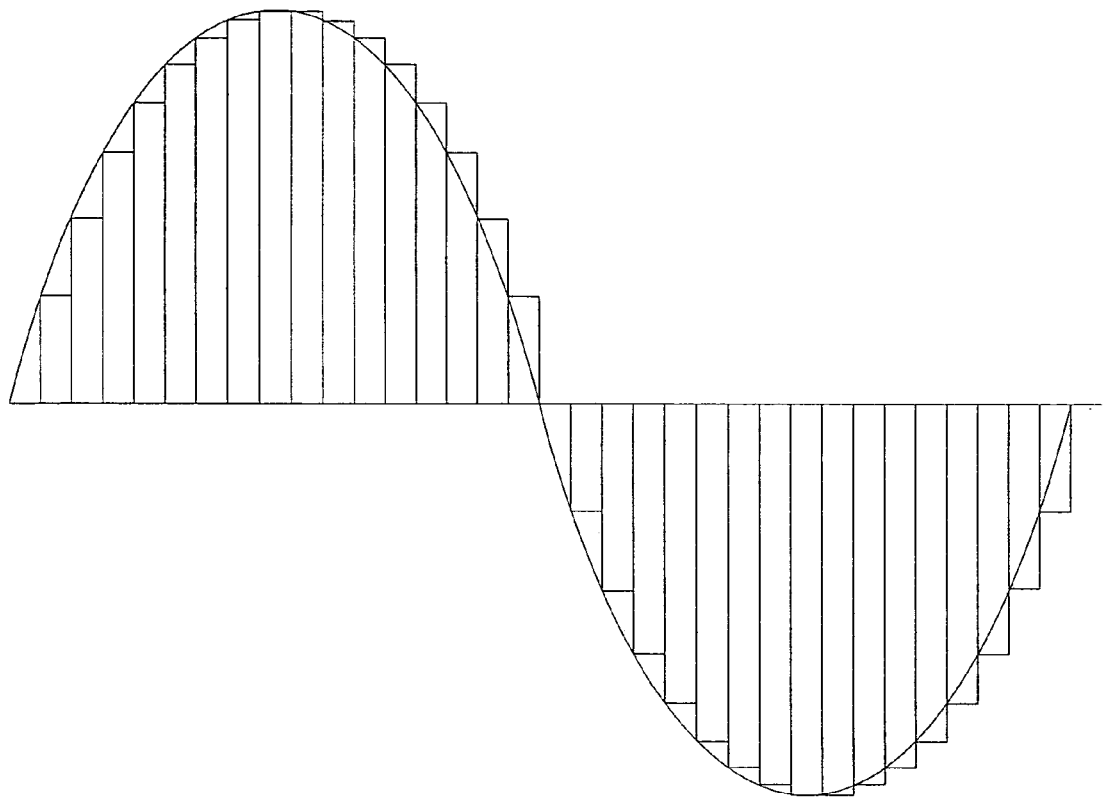
FIG. 6 is an illustration showing a digital, 10-bit (or greater) resolution, 34 samples per cycle representation of one cycle of a sine wave with DC offset removed. The sine wave being represented is also shown for reference.
Figure 7:
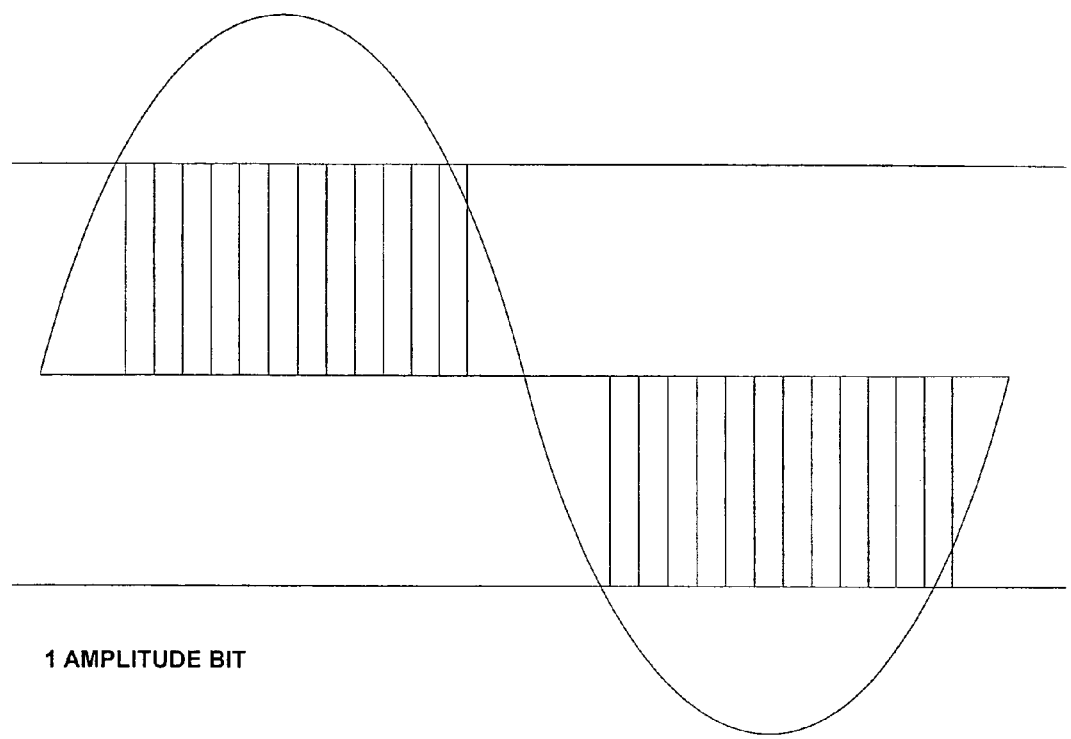
FIG. 7 is an illustration showing a digital, 1-bit resolution, 34 samples per cycle representation of one cycle of the reference sine wave of FIG. 6. The sine wave being represented is repeated for convenient comparison.
Figure 8:
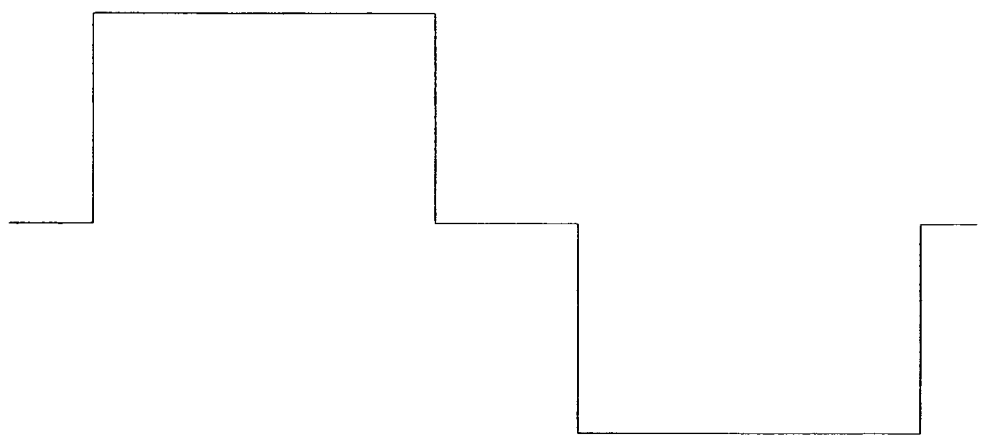
FIG. 8 is an illustration showing an isolated view of the digitized signal of FIG. 7.
Figure 9:
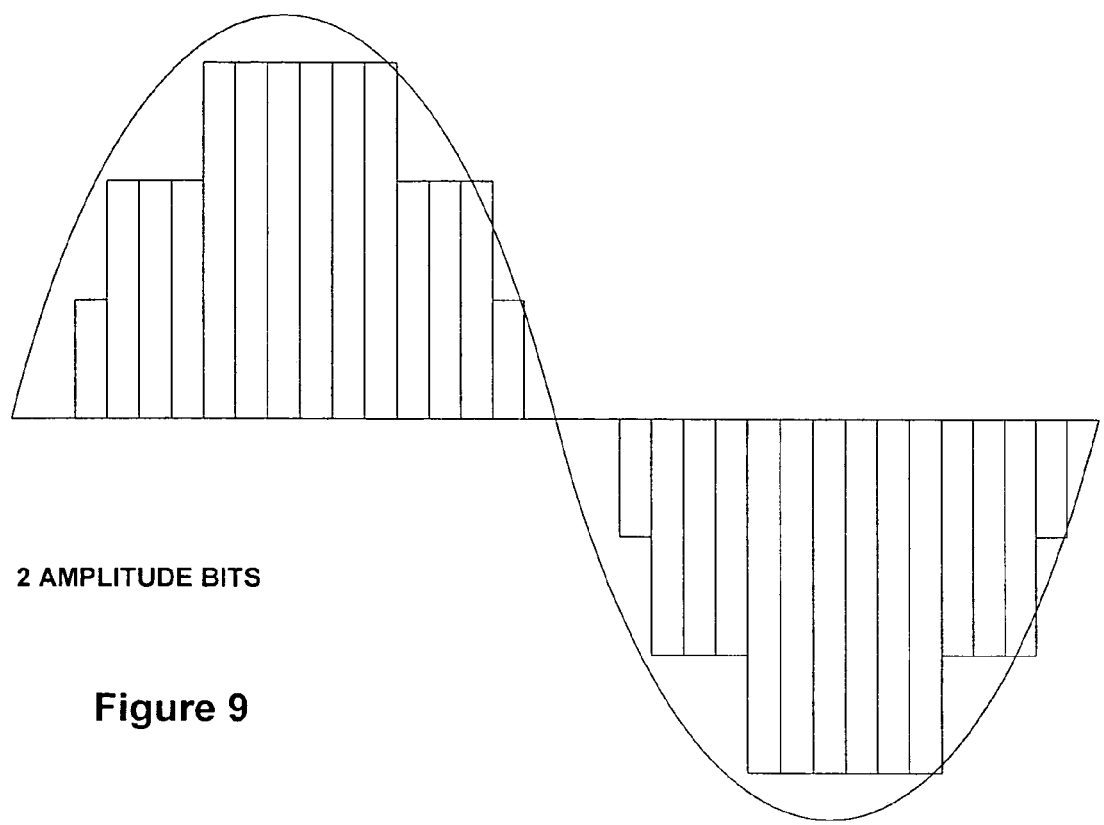
FIG. 9 is an illustration showing a digital, 2-bit resolution, 34 samples per cycle representation of one cycle of the reference sine wave of FIG. 6. The sine wave being represented is repeated for convenient comparison.
Figure 10:
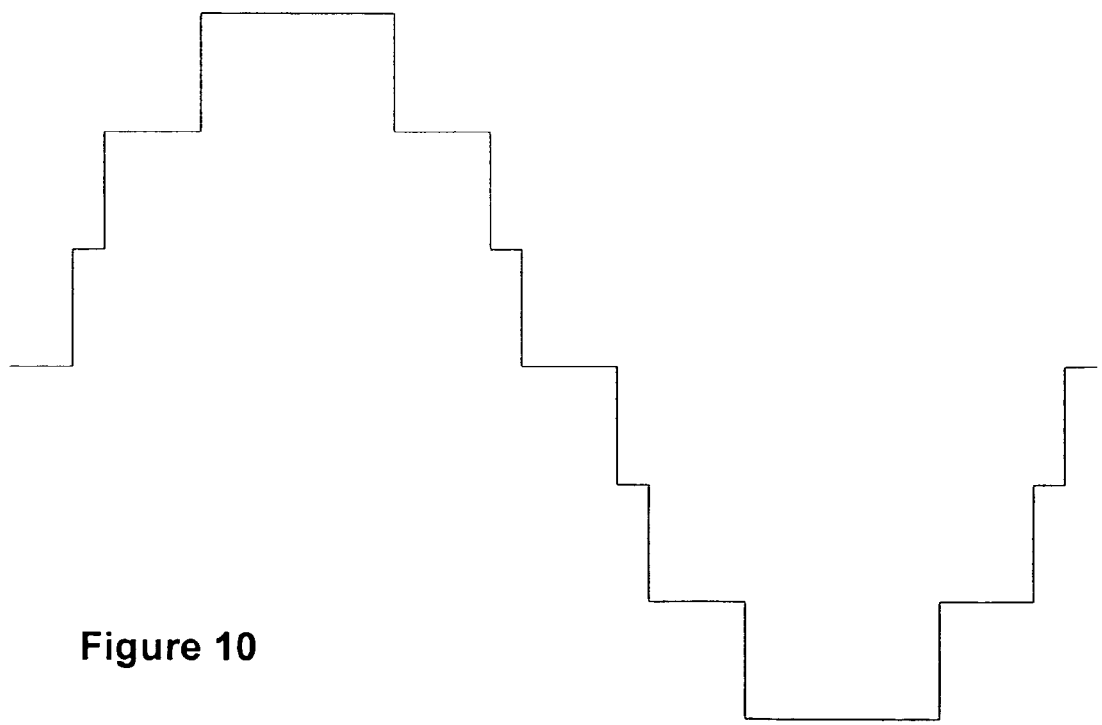
FIG. 10 is an illustration showing an isolated view of the digitized signal of FIG. 9.
Figure 11:
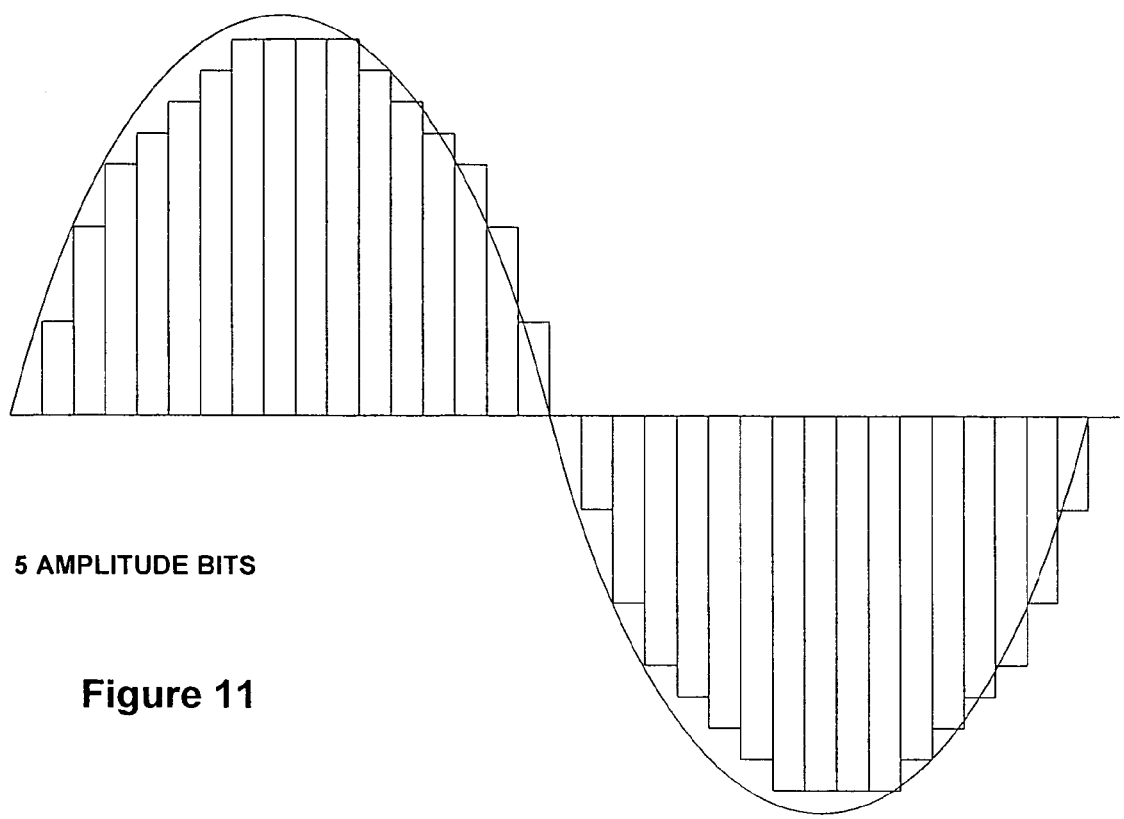
FIG. 11 is an illustration showing a digital, 5-bit resolution, 34 samples per cycle representation of one cycle of the reference sine wave of FIG. 6. The sine wave being represented is repeated for convenient comparison.
Figure 12:
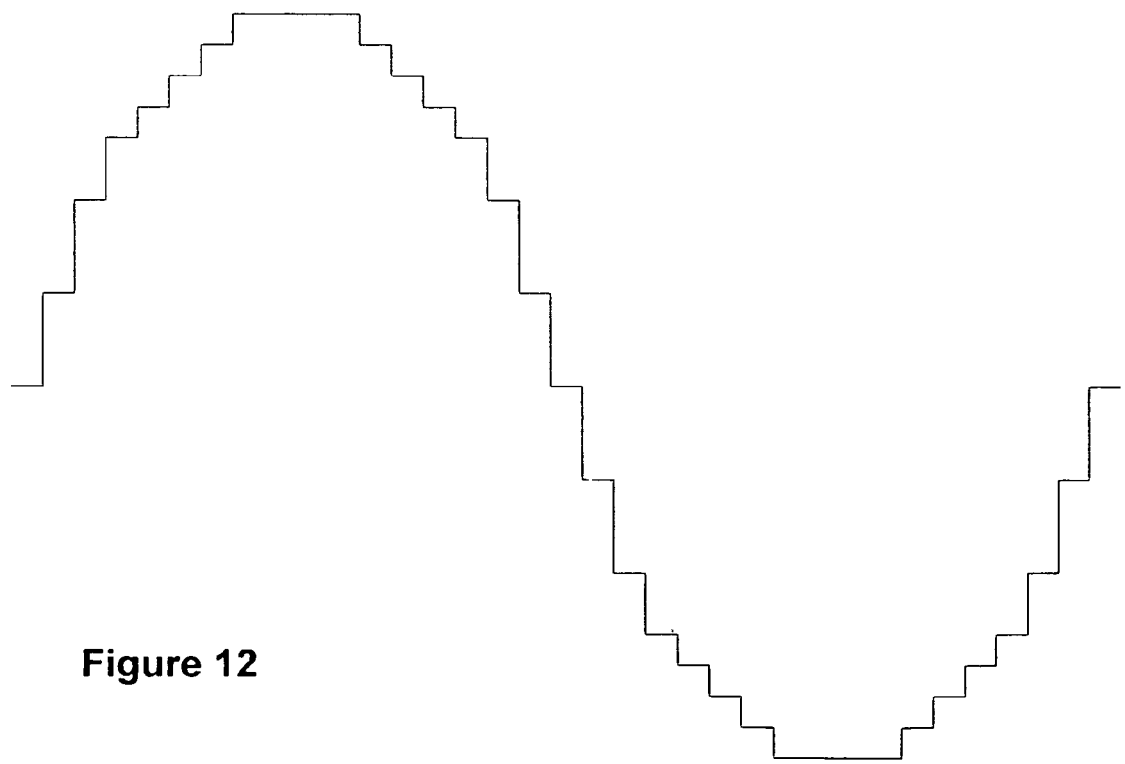
FIG. 12 is an illustration showing an isolated view of the digitized signal of FIG. 11.

The circuit of Embodiment 2400 is a modified form of typical DAC application 400 illustrated in FIG. 4. Circuit topology changes are limited to DAC sub-circuit U401 output networks and interface to analog load block 120. Capacitor C2401 couples the non-inverting to the inverting output of DAC U401 and the plus input to the minus input of instrumentation amplifier U2401 at nodes N425 and N426. Capacitor C2401 replaces capacitors C403 and C405 of example 400. The use of a single capacitor will typically be the preferred implementation because it provides a single path for current to flow between DAC U401 non-inverting and inverting outputs, avoids a ground connection with potential noise injection into high impedance circuits, and avoids tolerance variation in the capacitor values. Nevertheless, since there is a virtual ground associated with capacitor C2401, the output capacitor configuration of example 400 can be used where application requirements permit.

A major differentiator between a DAC application of the present art and the present invention is the role and functionality of capacitor C2401 (or equivalent alternate configuration). In the present art, capacitors on the output of the DAC function as high frequency filters. They primarily reduce the level of the clock signal and its harmonics that feed through and contaminate the output signal. The other function occurs in the highest speed applications where a following amplifier or buffer may lack the gain and response time characteristics to track DAC output signal with adequate stability margin. In such a case, the value of the filter capacitor is increased by a small amount over that necessary to filter the clock in order to slow the input to the amplifier and thus prevent overshoot or oscillation. The increase should be small in one embodiment and the technique has limited application since any artificial slowing the amplifier input is additional distortion of the waveform.

Figure 25:
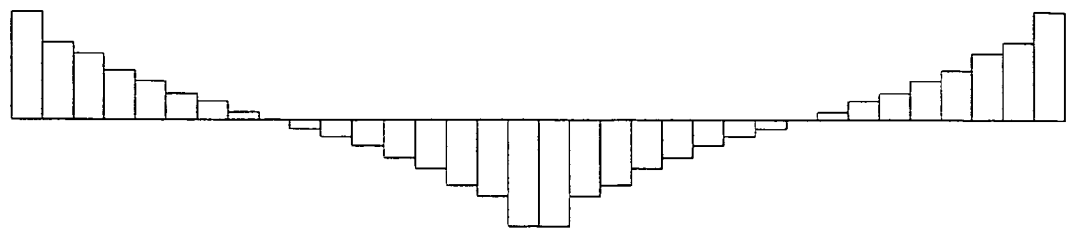
FIG. 25 is an illustration of the composite clocked waveform to input (in digital form) to the embodiment of the low distortion DAC of the present invention shown in FIG. 24, to produce a sine wave output signal.
Figure 26:
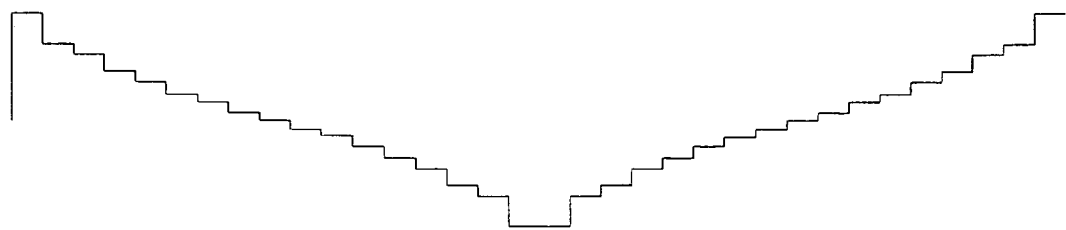
FIG. 26 is an illustration of the envelope of the waveform illustrated in FIG. 25.
Figure 27:
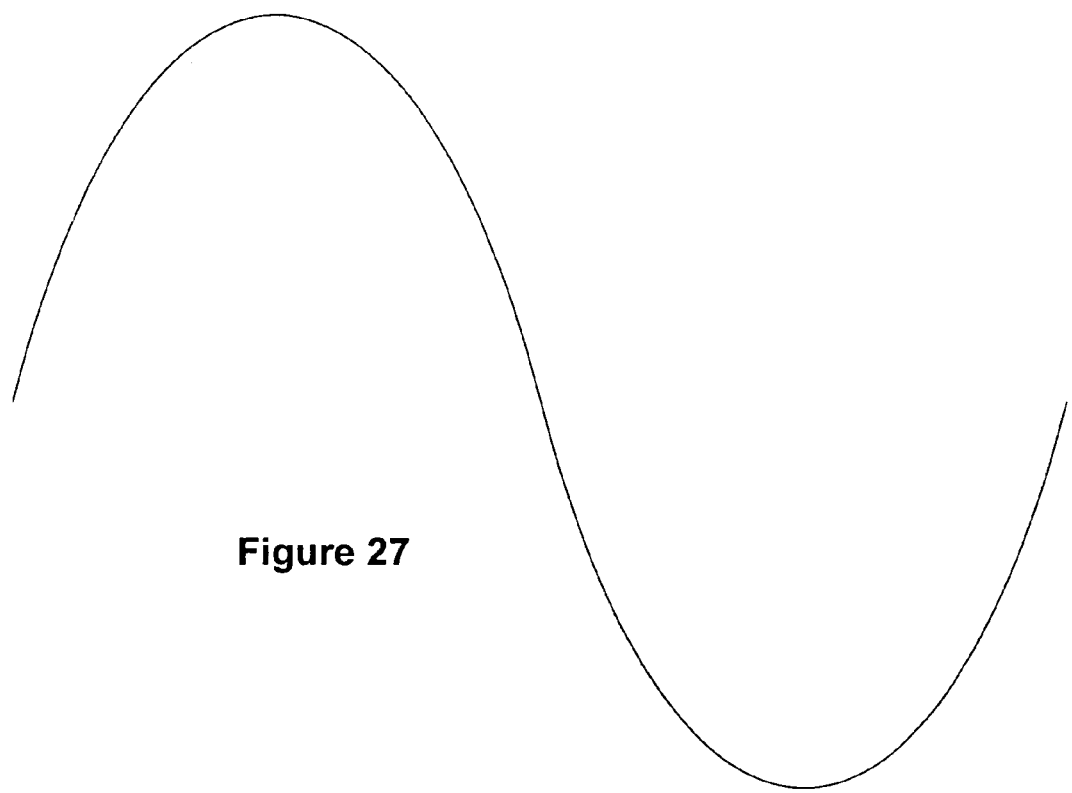
FIG. 27 is an illustration of the output waveform from the embodiment of the low distortion DAC of the present invention shown in FIG. 24, with input waveform (in digital form) illustrated in FIG. 25.

In the present invention, capacitor C2401 is substantially larger and performs the function of integrator 2310. Since integration of the output current from DAC sub-circuit U401 is the process by which the output signal is constructed, the input to U401 should represent the derivative (df(t)/dt) of the desired output signal. FIGS. 25 and 26 illustrate the digital levels and envelope of the input to embodiment 2400 for generation of the output sine wave of FIG. 27. The use of the signal derivative as input is a primary distinguishing characteristic of the present invention.

Since the denominator of the derivative input function is determined by the clock period, full scale current on DAC sub-circuit U401 and the maximum slew rate of the output signal should be used to set the value of capacitor C2401. Depending on the specific application and the degree of uncertainty as to the maximum slew rate, it may be desirable to set the predicted maximum a number of bits below full scale (full DAC sub-circuit output current). The value of capacitor C2401 may then be approximated from the differential equation relating voltage and current in a capacitor.

This technique works optimally in applications such as a digital signal synthesizer where the range and characteristics of the signals and their derivatives are known precisely. In some applications, the derivative and maximum slew rate may have a potentially significant level of uncertainty or variability. Said variability might be associated with an analog sensor and its environmental sensitivity, or other analog signal present in the system signal path preceding generation of the digital input signal to the present invention. Either the DSP or a feedback system may be employed to recalibrate the input signal, recalibrate the full scale range of DAC sub-circuit U401 by dynamically adjusting the value of resistor R401, or by varying the value of capacitor C2401 to change the maximum slew rate. The clock rate can also be varied to compensate for variations in the circuit or its environment.

The substantially larger value of capacitor C2401 in the present invention compared to the high frequency filter capacitors used in applications of the present art provides additional benefit. Capacitor C2401 is located such that it appears substantially across semiconductor junctions of current output DAC sub-circuit U401 output stage. As a large fixed value capacitor substantially in parallel with the junction capacitances of said output stage, capacitor C2401 tends to ballast said junction capacitances and thereby reduces the significance of their varactor characteristics. This in turn has the benefit of reducing the inter-modulation distortion of the output signal of DAC sub-circuit U401.

Use of an amplifier on the output of a DAC is common with the present art. However, they are typically voltage amplifiers or current buffers, providing a buffer stage with some gain but nothing more. DACs of the present art typically have conduction modulation and varactor effect problems associated with their output section. In a current output DAC the output is typically a parallel combination of the drains of multiple FETs. FETs have very large drain impedances but they are not infinite. As a result, output voltage variation across a resistor on the DAC output causes change in the current through the drains of the various FETs. There is another problem on the FET drains, namely varactor capacitance. Even if the capacitance were constant, it would generally badly degrade the DAC output impedance. The non-linear varactor capacitance is a major source of intermodulation distortion and is a direct result of the voltage change across the drain source/body capacitance. One way to avoid this problem and reduce the harmonic distortion caused by the conduction modulation is to reduce the output loading resistor value. While this can help, the amount of output signal also decreases in proportion to the change in the output resistor value. Typically, a good balance is achieved somewhere near 50 ohms.

The present invention reduces these problems to a minimum by the use of a form of transimpedance amplifier on the DAC output. A transimpedance amplifier converts a current signal in to a voltage signal. In the process, the output voltage of the DAC is held ideally to a zero voltage change. In practice the change is non-zero but very small. This reduced voltage change substantially reduces the two types of distortion previously mentioned. Since the output of a current DAC is current, even holding the voltage to zero volts does not reduce the signal and the output of the transimpedance amplifier supplies the required signal power. In the present invention, a capacitor replaces the feedback resistor in a conventional transimpedance amplifier, resulting in a circuit that is an inverting integrator that continues to operate as a transimpedance amplifier within its band of operation. This is the preferred implementation for the piecewise linear mode of operation described previously. Additional benefits of the integration circuit include a reduction of the high frequency components and a reduction in amplitude distortion due to a reduction in RC time constants on the output that affect a PWM type of modulation distortion.

Figure 33:
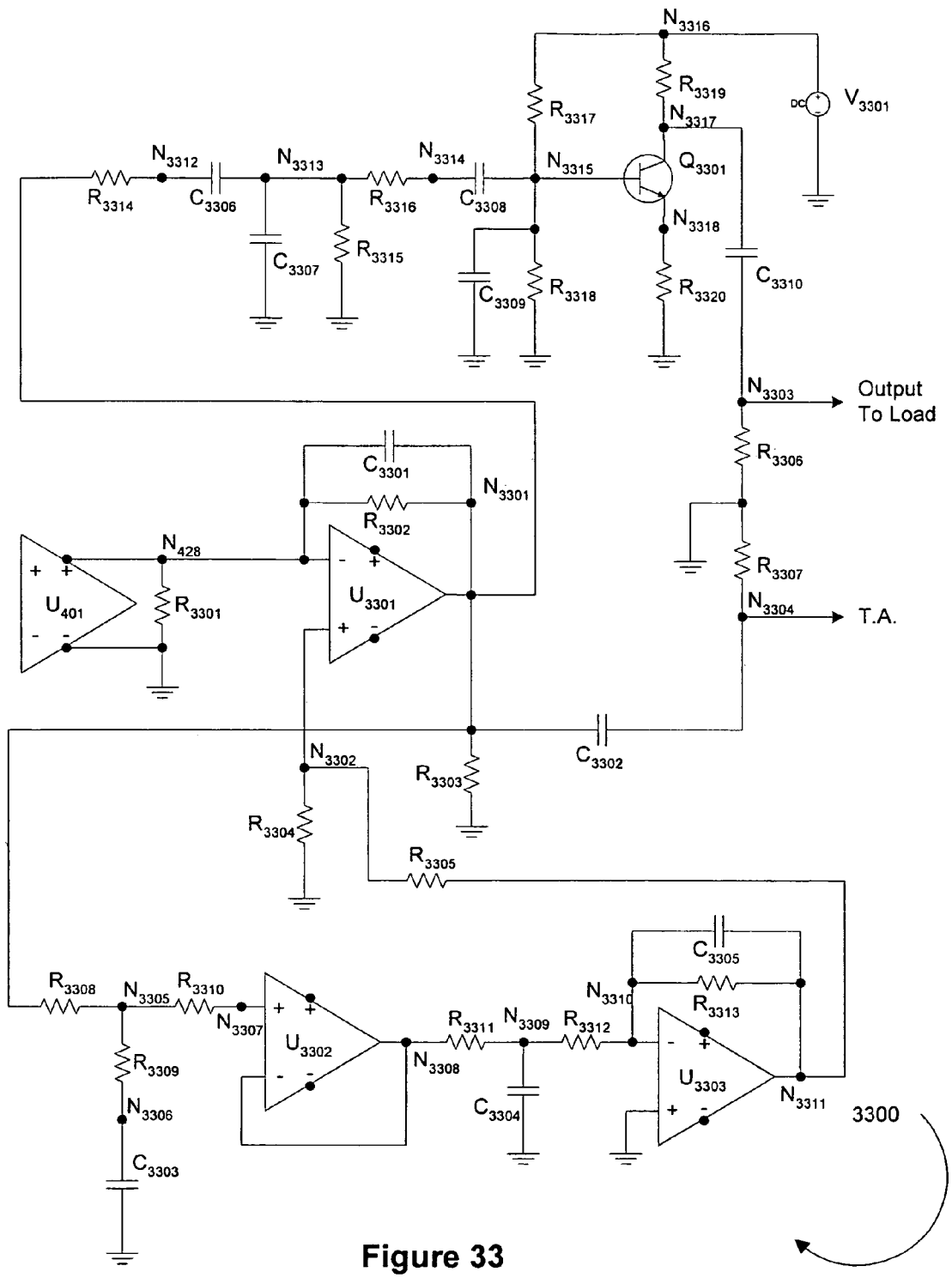
FIG. 33 is an example circuit implementation of the preferred embodiment of integrator and buffer functions illustrated in FIG. 23A.

A circuit of the preferred embodiment is shown in FIG. 33 where transimpedance amplifier circuit 3300 replaces simple capacitor C2401 and amplifier U2401. At low DAC clock frequencies, the circuit is preferably implemented using an operational amplifier, U3301. At high frequencies (defined as those above that at which an operational amplifier with adequate characteristics is available), the transimpedance amplifier function can be implemented with lower gain configurations such as a simple differential amplifier type.

Transimpedance amplifier 3300 holds the output voltage of DAC U401 at a substantially fixed voltage near ground. Since the voltage change is virtually zero, varactor characteristics have minimal effect and intermodulation distortion is substantially reduced compared to DAC output signals with the present art. Resistor R3301 is a low value compared to the typical compromise value of approximately 50 ohms described above. U3301, C3301, and R3302 form the transimpedance amplifier/inverting integrator circuit with the integration capacitor in the feedback path.

A transimpedance amplifier would typically have its positive input grounded. In the preferred embodiment of FIG. 33, the positive input is off ground to accommodate the grounding of the DAC negative output and conversion from a differential to single ended signal. A feedback circuit comprising operational amplifiers U3302 and U3303 with their associated passive resistor and capacitor components drives the positive input of the transimpedance. This feedback circuit functions to keep the output of the transimpedance amplifier well away from the limits of its operational range where gain compression and signal distortion would be introduced.

The preferred embodiment shown in FIG. 33 also incorporates a buffer amplifier formed by Q3301 and its associated bias, feedback, and filter passive components. A common emitter configuration amplifier was chosen to provide both voltage gain and a signal inversion. The RC network comprised of resistors R3314 through R3316 and capacitors C3306 through C3309 is a lead lag network which both allows gain flattening across the operating band of interest and contributes, in combination with bias, load, limiting and feedback resistors R3317 through R3320, to the amplifier satisfaction of stability criteria for its configuration. Power is AC coupled from the collector of Q3301 to the output node of the circuit, node N3303 through DC blocking capacitor C3310. Similarly, capacitor C3302 allows access to the unbuffered output of the transimpedance amplifier at node N3304. Node N3304 is labeled as test access in FIG. 33 since it is not necessary to circuit operation and can be eliminated along with Capacitor C3302 and resistor R3307.

The final major change involves the use of instrumentation amplifier U2401 in place of transformer T401 of example 400. This is required since the output signal of example 400 is in the form of a current provided by DAC sub-circuit U401 and the output signal of embodiment 2400 is a voltage measured differentially across capacitor C2401. Instrumentation amplifier U2401 also functions as Buffer Amplifier 2320. The choice of a simple buffer amplifier for isolation, an instrumentation amplifier with its inherently high common mode rejection, or some other form of amplifier depends on the specific application. Resistor R2401 couples the non-inverting output at node N428 to the inverting output at node N429 for instrumentation amplifier U2401. The value of resistor R2401 is typically non-critical and provides a small local load for instrumentation amplifier U2401. In some applications wherein the output signal of instrumentation amplifier U2401 is transmitted via a controlled impedance line, R2401 can function as the near end line termination resistor.

Wideband DAC Circuit

The use of an integrating capacitor introduces a bandwidth consideration for direct application of the low distortion DAC of embodiment 2400. The value of capacitor C2401 is selected to accommodate the highest slew rate of the output signal, which implies it is selected for the high end of the frequency band over which the DAC is to be responsive. This generates a problem at lower frequencies that is readily observable where the output waveform is triangular and the derivative is therefore a constant. For triangular outputs with the highest fundamental (repetition) frequency, where capacitor C2401 sets the slew rate at full resolution of DAC sub-circuit U401, everything is properly matched. For a triangular wave with the same slew rate and a fundamental frequency an octave lower, there are twice as many sample time points and twice as long for the signal to ramp. Generation of the proper output waveform requires the current to be reduced 50%, which is the equivalent of losing one bit (the MSB) resolution. For many applications, the loss of resolution with decreasing frequency may not pose a significant problem. However, if the operating bandwidth is 8 octaves with an 8-bit DAC, the resolution in the bottom octave will be only 1 bit, typically an unsatisfactory condition.

Figure 28:
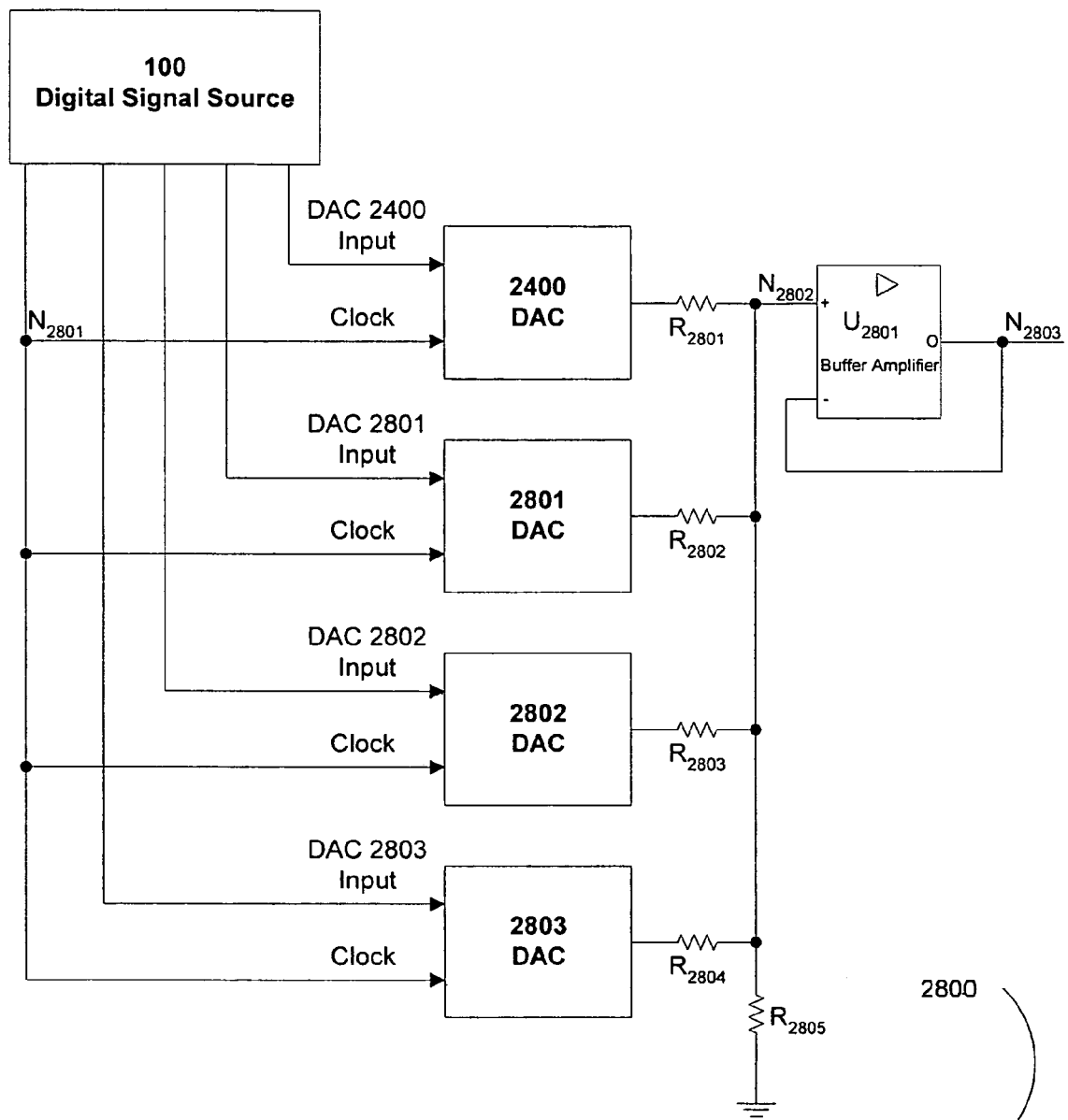
FIG. 28 is an embodiment of the low distortion DAC of the present invention with enhanced bit resolution, multiple current integrating capacitors, without feedback to digital signal source, providing wide band operation.

FIG. 28 illustrates embodiment 2800 that provides one method for both realization of wideband systems and avoids loss of DAC resolution at lower frequencies. Herein, the overall frequency band is divided into sub-bands. Embodiment 2800 utilizes 4 sub-bands wherein DAC 2400, DAC 2801, DAC 2802, and DAC 2803 are each a circuit of the form of embodiment 2400. Each of the 4 sub-bands will have its own digital data input (also its own clock for some applications) from the digital signal source 100. Since the input to each sub-circuit will not include out of band input data, the entire structure also functions as a band filter with internally generated harmonic and inter-modulation signals representing sources of distortion.

Each of the 4 sub-circuits will have its own capacitor value. Theoretically, the lower values could be selected as a multiple of 2 for the number of octaves of bandwidth of the system. However, this would have the effect of tying each sub-band performance to the maximum slew rate of the highest band. Typically, the slew rates will be lower so that triangle or ramp waveforms represent a worst-case situation where the maximum slew rate is the same at all frequencies across the operating band. If these types of waveforms are not applicable, the lower bands can have lower slew rates, larger capacitor values, and can be made wider in frequency coverage than higher bands.

The output signals from the 4 sub-bands are combined at summing node N2801 to generate the overall waveform across the entire operating band. Resistors R2801, R2802, R2803 and R2804 respectively couple the outputs of DAC 2400, DAC 2801, DAC 2802 and DAC 2803 to node N2801. Resistor R2805 couples node 2801 to ground. Node N2801 is also coupled to the non-inverting input of buffer amplifier U2801, which functions to isolate summing node N2801 from the DAC analog load at node N2802.

High Resolution, High Speed, Low Distortion DAC

FIG. 31 illustrates embodiment 3100 of the present invention that simultaneously provides low distortion, high speed, and high resolution in combination. High resolution is achieved by stacking high-speed, DAC sub-circuits to provide high-speed resolution greater than the 16-bits that is representative of the present art. Embodiment 3100 utilizes a stack comprising 3 high-speed, 8-bit DAC sub-circuits. Said sub-circuits are available in a single integrated sub-circuit at very low cost.

Figure 29:
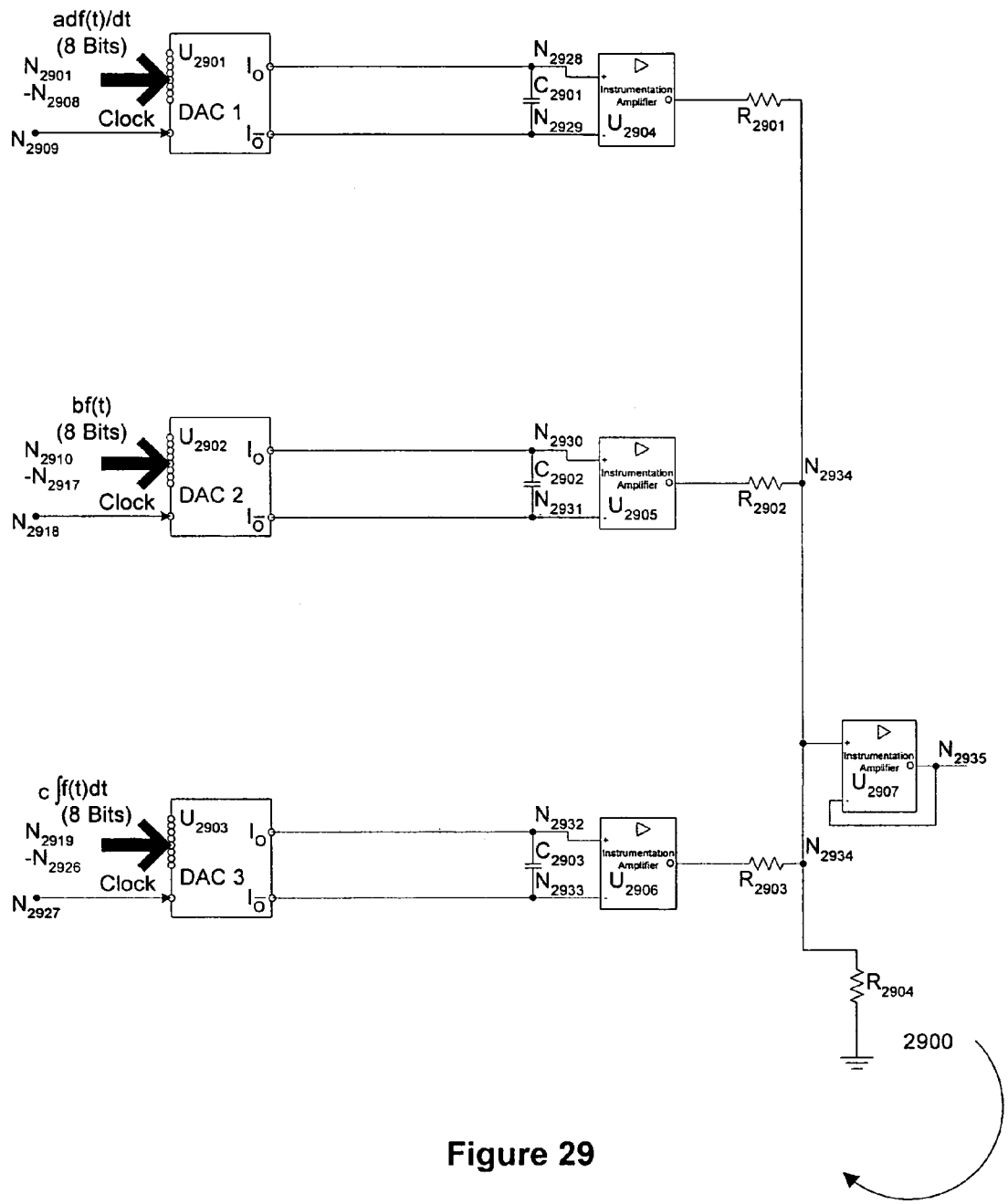
FIG. 29 is an embodiment of the of the forward signal conversion section of the low distortion DAC of the present invention with enhanced bit resolution, multiple current integrating capacitors and without feedback to digital signal source.
Figure 30:
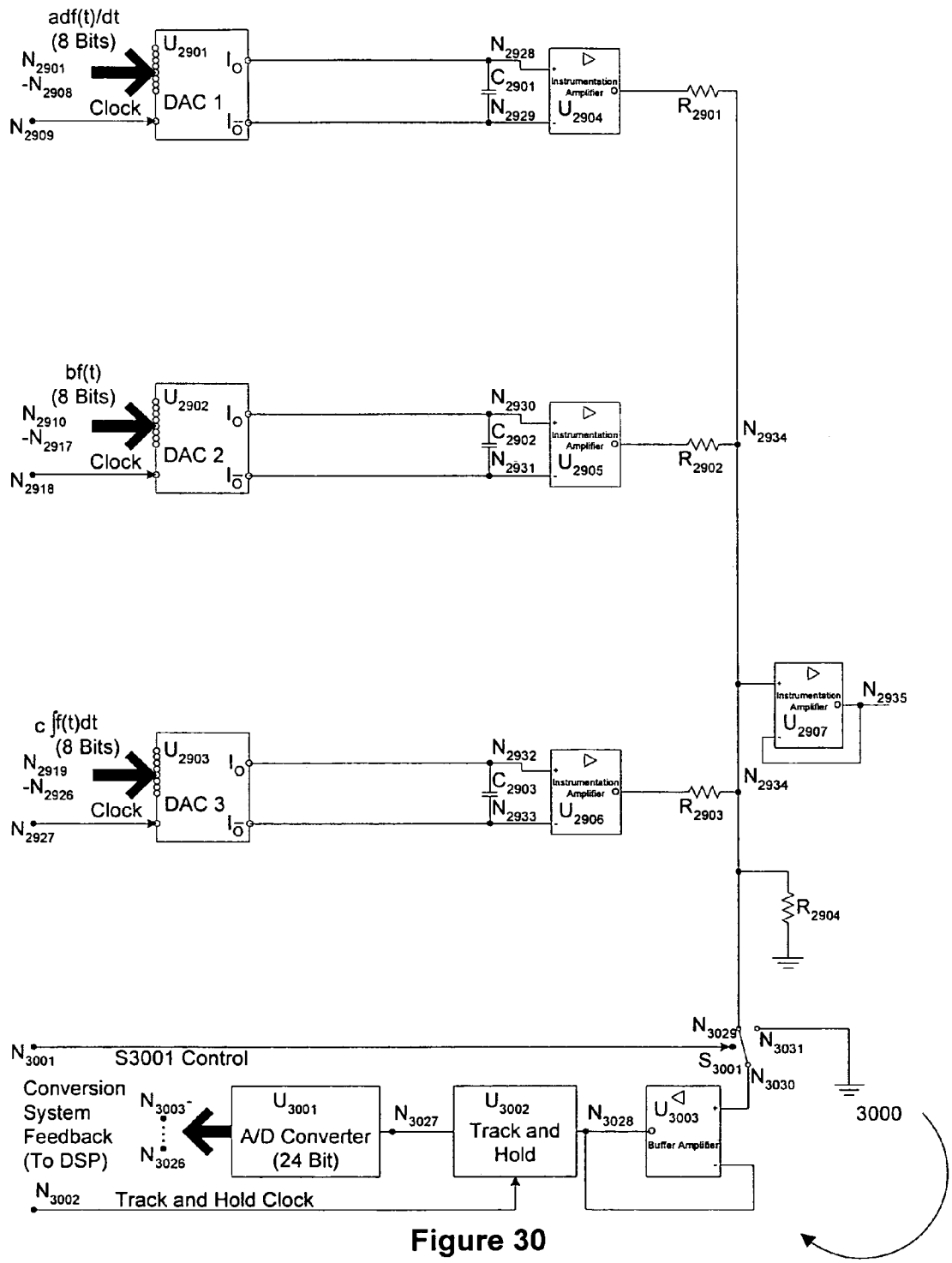
FIG. 30 is an embodiment of the of the low distortion DAC of the present invention with enhanced bit resolution, multiple current integrating capacitors and feedback to digital signal source.

FIG. 31 is complex so various major functional sections are shown in detail in FIGS. 29 and 30. FIG. 29 illustrates the forward, open loop, stacked, digital to analog conversion function. FIG. 30 adds the feedback circuitry for the over-all system to the circuit shown in FIG. 30. Realization of resolutions greater than 16 bits at high clock rates, or with structures stacking more than 2 DAC sub-circuits typically will require the use of feedback. Remaining circuitry forming preferred, high performance embodiment 3100 provides adjustment and feedback capability for each individual DAC sub-circuit forming the stack structure.

FIG. 29 illustrates the 3 low distortion DAC circuits of the form of embodiment 2400 that form the stacked DAC structure. Stacking is realized by scaling the output signal of each of the 3 embodiments before they are combined. The optimum weighting configuration is for full-scale output to equal the least significant bit of the next circuit with higher weighted output signal minus the least significant bit of the lowest weighted output signal. Theoretically, this provides up to 24 bits of resolution using 3 stacked 8 bit DAC sub-circuits. In practice, it may be desirable to provide overlap of one or more of the least significant bits to insure against gaps. For example within a stack of 3, 8-bit DACs, if 2 bits on each of the upper two circuits were not used due to designed overlap and 2 bits on the lowest DAC were ignored to avoid noise, the present invention could still provide 18 bits of conversion resolution with low distortion at high clock rates. This is 2 bits more than generally available at high cost in high speed DACs of the present art.

Referring to FIG. 29, DAC sub-circuits U2901, U2902, and U2903 receive independent data inputs and clock from digital signal source 100. Clock inputs for DAC sub-circuits U2901, U2902, and U2903 are coupled at nodes N2909, N2918, and N2927 respectively. Data inputs for DAC sub-circuit U2901 are coupled at nodes N2901 through N2908. Data inputs for DAC sub-circuit U2902 are coupled at nodes N2910 through N2917. Data inputs for DAC sub-circuit U2903 are coupled at nodes N2919 through N2926. Whereas the data input to U2901 shown represents a scaled first derivative of the desired output function f(t), the data inputs to U2902 and U2903 shown are not necessarily representations of the derivative, even though the outputs of all 3 DAC sub-circuits are integrated by capacitors C2901, C2902, and C2903 respectively. The nature and potential benefits of variations in the form of input data are discussed in detail below.

High speed, high resolution, low distortion output signals are achieved by combining the output signals from each circuit in the stack at summing node N2934. Output from the top or most heavily weighted circuit in the stack is the integral of the scaled first derivative input of the desired output function. Said input is converted to analog and integrated by capacitor C2901. Capacitor C2901 couples the non-inverting and inverting outputs of DAC sub-circuit U2901 and the non-inverting and inverting inputs of instrumentation amplifier U2904 at nodes N2928 and N2929 respectively. Output from instrumentation amplifier U2904 is coupled to summing node N2934 by resistor R2901.

For the second circuit in the stack, capacitor C2902 couples the non-inverting and inverting outputs of DAC sub-circuit U2902 and the non-inverting and inverting inputs of instrumentation amplifier U2905 at nodes N2930 and N2931 respectively. Output from instrumentation amplifier U2905 is coupled to summing node N2934 by resistor R2902. Similarly for the third circuit in the stack, capacitor C2903 couples the non-inverting and inverting outputs of DAC sub-circuit U2903 and the non-inverting and inverting inputs of instrumentation amplifier U2906 at nodes N2932 and N2933 respectively. Output from instrumentation amplifier U2906 is coupled to summing node N2934 by resistor R2903.

Resistor R2904 couples summing node N2934 to ground. Summing node N2934 is also coupled to the non-inverting input of buffer amplifier U2907, which isolates summing node N2934 from noise injection through the output and from loading effects of downstream circuitry. Not shown in series with each output of DAC sub-circuits U2901, U2902, and U2903 are low speed, high-resolution DAC circuits that cancel the DC offset (or zero value current) for that DAC. High resolution in said series DC offset cancellation DACs can also provide capability to more closely match the currents for the inverting and non-inverting outputs within each DAC sub-circuit.

Ignoring the benefits of non-step transitions discussed previously, the circuit depicted in FIG. 29 would represent a high-resolution DAC circuit. However, the resolution depicted cannot typically be realized at high speed because signal levels and component tolerances limit the benefits of simple stacking. For a DAC sub-circuit with a maximum output current of 0.020 amperes at the top of the stack, the least significant bit for the entire stack would be approximately 1.2 nanoamperes. Whereas potential noise signals coupling into the circuit can easily exceed this level by more than an order of magnitude, and whereas current output DACs have high impedance outputs, the circuit simply will not function over such a wide dynamic range. In high-speed DAC circuits of the present art, high-resolution devices typically utilize an internal stack of 2 lower resolution DACs. Stacking in the present art is limited by a combination of the spread of component values, component tolerances, range of signal levels, and tolerances and variability in materials and manufacturing processes.

Except in open loop embodiment 2400 and equivalent, implementations of the present invention overcome such limitations by the incorporating feedback and gain into the circuit. Most significant is the circuit to provide overall feedback of the output signal to digital signal source 100 as illustrated in FIG. 30. The overall feedback circuit in FIG. 30 comprises switch S3001, buffer amplifier U3003, track and hold U3002, and A/D converter U3001. Dedicated input signals for said overall feedback circuit comprise S3001 Control at node N3001 and Track and Hold Clock at node N3002. Not shown is the clock for A/D converter U3001, which may be either an additional dedicated input signal from digital signal source 100 or a clock internally derived from the Track and Hold Clock. A/D converter U3001 provides digital Conversion System Feedback signals to digital signal source 100 at nodes N3003 through N3026.

A/D convert U3001 is a 24-bit device since the resolution of the feedback signal should equal the resolution of the forward digital to analog conversion at a minimum. Having the feedback resolution 2 to 3 bits greater is preferred, but resolutions greater than 24-bits are not common components. As previously mentioned, 24-bit DAC circuits of the present art are limited to a maximum sample rate of a few tens of kilohertz. In practice, high speed, high-resolution A/D converters are at least marginally more difficult to realize and more costly than DACs of the same performance level. This difficulty is overcome by use of a low speed 24-bit A/D converter that gets its input from a track and hold circuit U3002 at node N3027 that provides time synchronized sampled data points to compare with the commanded value. Feedback is accomplished by a continuous sample data system as opposed to comparing entire waveforms. Calculated deviations are used to adjust the appropriate error correction value stored in a memory lookup table. Buffer amplifier U3001 provides the input signal for the track and hold at node N3028. Input signal to buffer amplifier U3001 is switched by switch S3001 between summing node voltage at node N2934 during normal operation and ground at node N3031 during calibration of offset in the overall feedback loop.

Referring to FIG. 31, the remaining circuits are associated with drift, offset and error correction for the output associated with each individual DAC sub-circuit comprising the 3 high 8-bit DAC stack. DACs U3101, U3103 and U3105 inject currents that are combined with the output current from primary signal conversion DACs U2901, U2902, and U2903. Currents are combined out of phase with non-inverting output of U3101 coupled to inverting output of U2901 at node N3164. Inverting output of U3101 is coupled to non-inverting output of U2901 at node N3165. Digital inputs to U3101 are coupled at nodes N3101 through N3108. Similar connections apply for U3103. The non-inverting output of U3103 is coupled to the inverting output of U2902 at node N3166. Inverting output of U3103 is coupled to non-inverting output of U2902 at node N3167. Digital inputs to U3103 are coupled at nodes N3122 through N3129. For U3105, non-inverting output of U3105 is coupled to the inverting output of U2903 at node N3168. Inverting output of U3105 is coupled to non-inverting output of U2903 at node N3169. Digital inputs to U3105 are coupled at nodes N3143 through N3150.

Switches S3101, S3102 and S3103 are nominally double-pole, single-throw switches that couple the differential analog outputs of DAC sub-circuits U2901, U2902, and U2903 to differential inputs of instrumentation amplifiers U2904, U2905, and U2906 respectively when in the normally closed position. Switched into the normally open position, switches S3101, S3102, and S3103 respectively short both terminals of integrating capacitors C2901, C2902, and C2903 to ground. This effectively opens the feedback loops associated with individual converter circuits in the overall stack structure. With loops open and integration capacitors shorted, the offset and drift errors contributed by instrumentation amplifier and feedback loop components can be determined for each loop and stage of the stack.

Switches S3104, S3105 and S3106 perform similar functions to switches S3101, S3102 and S3103 respectively on the respective feedback loops. Switches S3104, S3105, and S3106 open their respective feedback loops following the output of the respective instrumentation amplifiers U2904, U2905, and U2906. Switches S3104, S3105, and S3106 are nominally single-pole, single-throw switches. All switches including switch S3001 will typically be analog FET devices, particularly if the overall DAC system is fully integrated into integrated circuits.

Switch connections for embodiment 3100 are as follows. For switch S3101, both normally open terminals are coupled to ground at node N3170. Normally closed terminal for pole 1 is coupled to the non-inverting output of U2901 at node N3165. The common terminal for pole 1 is coupled to C2901 and the non-inverting input of U2904 at node N2928. Normally closed terminal for pole 2 is coupled to the inverting output of U2901 at node N3164. The common terminal for pole 2 is coupled to C2901 and the inverting input of U2904 at node N2929.

For switch S3102, both normally open terminals are coupled to ground at node N3171. Normally closed terminal for pole 1 is coupled to the non-inverting output of U2902 at node N3167. The common terminal for pole 1 is coupled to C2902 and the non-inverting input of U2905 at node N2930. Normally closed terminal for pole 2 is coupled to the inverting output of U2902 at node N3166. The common terminal for pole 2 is coupled to C2902 and the inverting input of U2905 at node N2931.

For switch S3103, both normally open terminals are coupled to ground at node N3172. Normally closed terminal for pole 1 is coupled to the non-inverting output of U2903 at node N3169. The common terminal for pole 1 is coupled to C2903 and the non-inverting input of U2905 at node N2932. Normally closed terminal for pole 2 is coupled to the inverting output of U2903 at node N3168. The common terminal for pole 2 is coupled to C2903 and the inverting input of U2905 at node N2933.

For switch S3104, the normally closed terminal at node N3177 is coupled to resistor R2901 and the output of instrumentation amplifier U2904 at node N3176. The normally open terminal at node N3178 is coupled to ground. The common terminal at node N3179 is coupled to the non-inverting input of buffer amplifier U3107.

For switch S3105, the normally closed terminal at node N3181 is coupled to resistor R2902 and the output of instrumentation amplifier U2905 at node N3180. The normally open terminal at node N3182 is coupled to ground. The common terminal at node N3183 is coupled to the non-inverting input of buffer amplifier U3108.

For switch S3106, the normally closed terminal at node N3185 is coupled to resistor R2903 and the output of instrumentation amplifier U2906 at node N3184. The normally open terminal at node N3186 is coupled to ground. The common terminal at node N3187 is coupled to the non-inverting input of buffer amplifier U3109.

Buffer amplifiers U3107, U3108, and U3109 provide isolation of the analog output signal at nodes N3176, N3180, and N3184 from noise injection (particularly digitizing noise from A/D converters U3102, U3104, and U3106) via the feedback path for each DAC function within the stack. The output of each buffer amplifier is coupled to its inverting input, providing a unity gain configuration. The gain can be increased as warranted by the requirements of specific application within overall loop stability and dynamic range limitations. The output of respective buffer amplifiers U3107, U3108, and U3109 is also coupled to the analog inputs of A/D converters U3102, U3104, and U3106 at nodes N3167. N3168, and N3169.

A/D converters U3102, U3104, and U3106 convert the analog feedback signals for the respective stacked DAC circuits to digital form for processing by digital signal source 100. Digital output signals from U3102 are coupled at nodes N3112 through N3121. Digital output signals from U3104 are coupled at nodes N3133 through N3142. Digital output signals from U3106 are coupled at nodes N3154 through N3163. As illustrated, A/D converters U3102, U3104, and U3106 are 10-bit devices. As previously discussed with regard to A/D converter U3001, the preferred situation is for A/D converters within feedback loops to have higher resolution than the corresponding DAC in the stack. This not only removes any possibility of ambiguity, but also can provide near real time waveform comparison and error correcting adjustment capability. The latter capability will generally be appropriate where the cost of feedback A/D converters is low. This is generally the case illustrated in FIG. 31 with 8-bit D/A and 10-bit A/D converters. A/D converters of 12-bits and greater can be used at increasing cost.

Figure 32:
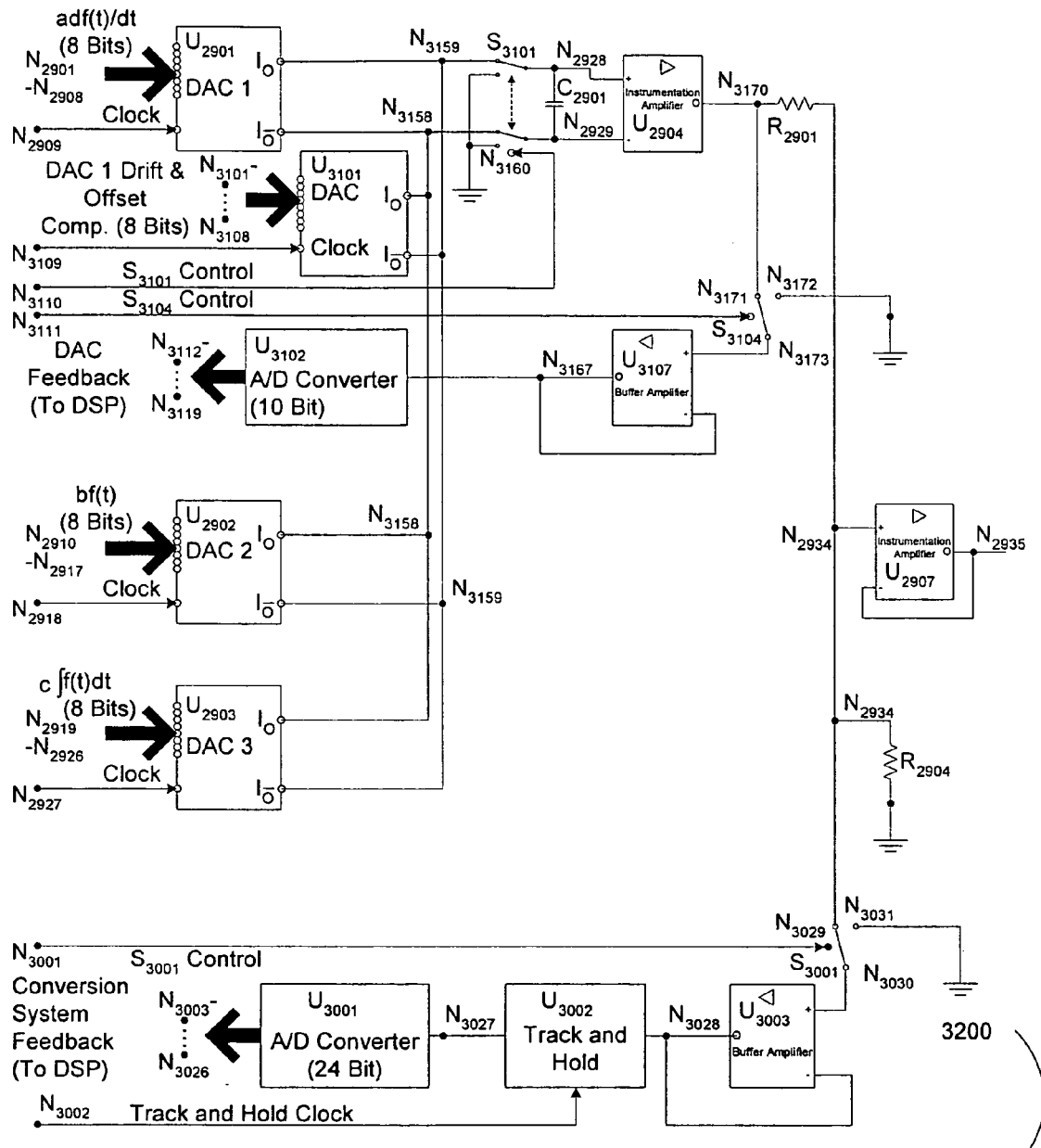
FIG. 32 is an embodiment of the low distortion DAC of the present invention with enhanced bit resolution, single current integrating capacitor and multiple feedback signals to the digital signal source.

High Resolution, High Speed. Low Distortion DAC with Common Integration Capacitor FIG. 32 illustrates embodiment 3200 that represents a simplified implementation to realize performance approaching that of the circuit of embodiment 3100. Embodiment 3200 utilizes a common integration capacitor for more than one sub-circuit section in the stack. Embodiment 3200 eliminates any impact of variation due to component tolerances among integration capacitors within a stack structure. It should be noted that embodiment 3200 does not add any components to embodiment 3100 while eliminating 2 integration capacitors, 2 drift compensation DAC sub-circuits, 4 switches, 4 buffer amplifiers, 2 A/D converters, and 2 signal combining resistors (and all ancillary components such as bypass capacitors associated with said eliminated components). In embodiment 3200, the non-inverting outputs of DAC1, DAC2 and DAC3 are coupled together at node N3165 and the inverting outputs are coupled together at node N3164. As shown, embodiment 3200 does not provide independent drift and offset compensation and feedback for DAC2 and DAC3. Additional switches could be incorporated to allow the circuitry performing these functions for DAC1 to also perform them for DAC2 and DAC3. However, this places these calibration operations in series and is not optimum for the highest speed, highest resolution applications.

Input Data Forms

Independent clock and data input capability, combined with of multiple DAC sub-circuits in a weighted stack configuration and the capability to integrate each DAC sub-circuit output provides the user of the circuit with additional applications and capability to further reduce distortion compared with embodiment 2400. The input to each DAC sub-circuit can represent part of the high-resolution representation of the derivative of the desired output waveform. Each circuit in the stack integrates its portion of the derivative providing a higher resolution, lower distortion output than achieved with a single section. Since the derivative is a constant between time points, the output waveform will simply be a higher resolution version than obtained with embodiment 2400, a linear transition as illustrated in FIG. 22A.

Since the second and subsequent circuits in the stack provide weighted but small changes to the output of the first circuit in the stack, they can be used in conjunction with the prior knowledge of the waveform to make fine adjustments to the target level for subsequent time 20 points to obtain a "better" curve fit as illustrated in FIGS. 22B and 22C. The waveform segment in FIG. 22B might be viewed as a "better" representation than that in FIG. 22A because the maximum deviation from the actual waveform is less. As illustrated, FIG. 22B exhibits a time shift so that the actual waveform might be as shown in FIG. 22C.

Another common situation occurs where the clock rate is insufficient to fully track waveform characteristics. FIG. 22D illustrates an example that might represent a leading edge spike and ring on a low-to-high transition in a high-speed digital waveform. In such situation, the clock rate cannot be increased to provide the necessary waveform tracking ability. In some approaches, the negative derivative at the end time point might even be used to "predict" a value that would introduce considerable error. FIG. 22E illustrates the next time point added to the waveform and again shows the "better" adjusted fit enabled by the higher resolution capability of embodiment 2900.

One of the more useful aspects of the stack configuration to tighten the effective tolerance of the initial, highest weighted DAC circuit. If the second and subsequent DAC circuits are used to provide error correction the 256 data points of an 8-bit DAC remain but the tolerance can be tightened up to the equivalent of a 24-bit converter for a 3-stack implementation. The range embodied in the 16-bit error correction circuits in the stack also allow the adjustment to the initial 256 target data point to artificially achieve higher resolutions up to 24-bits. Adjustment and error correction values are typically stored in look-up tables that provide the proper input values for each DAC circuit in the stack. Values stored in look-up tables are updated based on digital feedback signals from individual DAC circuits in the stack and the output signal from the overall DAC system.

The most significant benefit is illustrated by use of the inputs shown in FIGS. 29, 30, and 31. The input to the top stage in the stack is an 8-bit digital representation of scaled derivative a(df(t)/dt) for the desired output waveform f(t). When integrated by capacitor C2901, the first stage contributes a linear transition component to the output waveform in the form Af(t). The input to the second stage (or middle stage in the 3 stage illustration of FIG. 29) is an 8-bit digital representation of scaled output function bf(t) for the desired output waveform f(t). When integrated by capacitor C2902, the second stage contributes a quadratic term of the form $B(f(t))^2$. The integration constant representing a dc offset may be eliminated by ac coupling or accounted for by digital signal source 100. The input to the third stage is an 8-bit digital representation of scaled integral $c\int f(t)dt$ for the desired output waveform f(t). When integrated by capacitor C2903, the third stage contributes a cubic term of the form $C(f(t))^3$. When individual outputs from the 3 stages are combined, the actual output waveform f(t) is represented by a function of the form $Af(t)+B(f(t))^2+C(f(t))^3$. The presence of the higher order second and third terms provides the capability for non-linear curve fitting as illustrated in FIG. 22F. The illustration in FIG. 22G provides an easy comparison among the waveform segment in FIG. 22F, a three-point non-linear match, and linear transition provided by embodiment 2400.

Use of higher order curve fitting can provide a further significant reduction in output waveform distortion. Use of digital input functions for each sub-circuit in a stack that are successive integrations of the input beginning with the first derivative for the top or first stage provides very practical benefits. Since a common clock effectively sets the dt for the derivative and various integral functions, digital inputs for subsequent time points stage can be calculated using simple, very high speed addition and subtraction operations.

In addition to the embodiments depicted and features discussed, there are many forms and configurations that may provide significant advantages and capabilities in a specific application. Variations may include differences in the number of bits of resolution for various stages in stacked, high-resolution configurations, use of multiple, high-resolution stacked configurations within the wideband embodiment illustrated in FIG. 28, use of lower resolution DAC sub-circuits with a larger number of stacked stages to enable higher resolution than achievable with the present art at very high clock rates, use of different values for critical components such as integrating capacitors and signal combining resistors for different stages within a stack structure, among others.

Thus, a low distortion digital to analog converter system is described in conjunction with one or more specific embodiments. The invention is defined by the following claims and their full scope of equivalents.

We claim:

1. A DAC circuit, comprising:

means to convert one or more clocked digital input signals from a high resolution digital signal source to a high resolution analog output signal, wherein said digital input signals include a data signal and a digital representation of a first derivative of said analog output signal;

means to provide feedback of the analog output signal to the digital signal source to be combined with the data signal and wherein a transition of said analog output signal between a clocked change in said digital input signals is a linear curve.

2. A DAC circuit, comprising:

means to convert one or more clocked digital input signals from a high resolution digital signal source to a high resolution analog output signal, wherein said digital input signals include a data signal and a digital representation of a first derivative of said analog output signal;

means to provide feedback of the analog output signal to the digital signal source to be combined with the data signal and wherein a transition of said analog output signal between a clocked change in said digital input signals is a spline curve.

3. A digital to analog conversion system comprising:

a plurality of sub-circuits, each sub-circuit having one or more current output DACs integration means for integrating output current from the one or more output DACs, and isolation means to isolate the integration means from outputs of other of the sub-circuits;

scaling means coupled to the plurality of sub-circuits to scale the output current from each of the sub-circuits relative to the output currents of remainder of the plurality of sub-circuits; and combining means to combine the output currents from each of the plurality of sub-circuits.

4. The system of claim 3 further including means for isolation of the combined output from load circuitry.

5. The system of claim 3 wherein each of the current output DACs receive independent digital input signals.

6. The system of claim 3 further including means to sample the combined output and feedback the sampled signal to the digital signal source.

7. The system of claim 6 wherein the sampling and feedback means is a time synchronized, continuous, sample data system.

8. The system of claim 3 including means to compensate each DAC output current.

9. The system of claim 8 wherein the compensation means comprise compensation current output DACs with outputs connected in parallel to, but out of phase with, each current output DAC.

10. The system of claim 9 further including output sampling and feedback means for each DAC sub-circuit output wherein the sampling and feedback means is a time synchronized, continuous, sample data system.

11. The system of claim 3 further including means to calibrate each feedback signal in comparison to a known signal value.

12. The system of claim 3 wherein the integration means are transimpedance amplifier/inverting integrator circuits.

13. The system claim 12 wherein the transimpedance amplifier/inverting integrator circuits include an integrating capacitor in the feedback network of each transimpedance amplifier/inverting integrator circuit.

14. The system of claim 12 wherein the transimpedance amplifier/inverting integrator circuit includes means to control the reference voltage input of each transimpedance amplifier/inverting integrator.

* * * * *